(12) United States Patent
Kuge

(10) Patent No.: US 9,070,746 B2
(45) Date of Patent: Jun. 30, 2015

(54) NONVOLATILE SEMICONDUCTOR MEMORY DEVICE AND METHOD FOR MANUFACTURING SAME

(71) Applicant: KABUSHIKI KAISHA TOSHIBA, Minato-ku, Tokyo (JP)

(72) Inventor: Nobuhito Kuge, Mie-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/149,700

(22) Filed: Jan. 7, 2014

(65) Prior Publication Data
US 2015/0028409 A1    Jan. 29, 2015

(30) Foreign Application Priority Data

Jul. 29, 2013   (JP) .................................. 2013-156523

(51) Int. Cl.
| | |
|---|---|
| *H01L 21/764* | (2006.01) |
| *H01L 21/762* | (2006.01) |
| *H01L 27/115* | (2006.01) |
| *H01L 29/06* | (2006.01) |
| *H01L 29/49* | (2006.01) |

(52) U.S. Cl.
CPC ........ *H01L 21/764* (2013.01); *H01L 21/76289* (2013.01); *H01L 27/11524* (2013.01); *H01L 27/11529* (2013.01); *H01L 29/0649* (2013.01); *H01L 29/4991* (2013.01)

(58) Field of Classification Search
CPC ................. H01L 2221/1042; H01L 21/76264; H01L 21/76289; H01L 21/764; H01L 21/7682; H01L 27/11521; H01L 27/11524; H01L 27/11529; H01L 29/0642; H01L 29/0649; H01L 29/0653; H01L 29/4991
See application file for complete search history.

(56) References Cited

U.S. PATENT DOCUMENTS

| | | | |
|---|---|---|---|
| 8,212,308 B2 * | 7/2012 | Nishihara et al. ............. | 257/321 |
| 2012/0238099 A1 | 9/2012 | Shundo et al. | |
| 2012/0241838 A1 * | 9/2012 | Nagashima et al. ......... | 257/316 |
| 2013/0026600 A1 * | 1/2013 | Matthew et al. .............. | 257/522 |
| 2013/0059422 A1 * | 3/2013 | Lee et al. ....................... | 438/268 |
| 2013/0119450 A1 | 5/2013 | Naito et al. | |
| 2013/0248971 A1 * | 9/2013 | Miyazaki et al. ............. | 257/319 |
| 2014/0048890 A1 * | 2/2014 | Lee et al. ....................... | 257/401 |
| 2014/0159135 A1 * | 6/2014 | Fujimoto et al. .............. | 257/324 |

FOREIGN PATENT DOCUMENTS

| | | |
|---|---|---|
| JP | 2013-098490 A | 5/2013 |
| JP | 2013-105990 A | 5/2013 |

* cited by examiner

*Primary Examiner* — Eduardo A Rodela
(74) *Attorney, Agent, or Firm* — Holtz, Holtz, Goodman & Chick PC

(57) ABSTRACT

According to one embodiment, a nonvolatile semiconductor memory device includes: a plurality of first semiconductor regions arranged each via a space in a direction crossing a first direction; a plurality of control gate electrodes; and a select gate electrode extending in a second direction, and the select gate electrode aligned with a control gate electrode located on an outermost side out of the plurality of control gate electrodes via the space; a first insulating layer covering the plurality of control gate electrodes and the select gate electrode, the first insulating layer provided on a side wall of the select gate electrode via the space, and a portion of the first insulating layer bridged between adjacent ones of the plurality of control gate electrodes protruding toward the space between adjacent ones of the plurality of control gate electrodes.

9 Claims, 27 Drawing Sheets

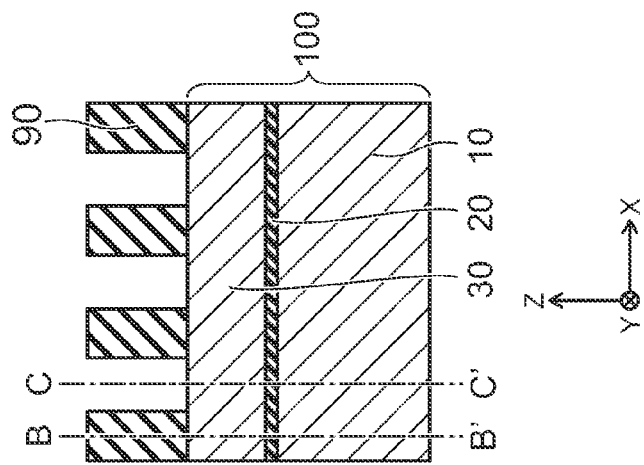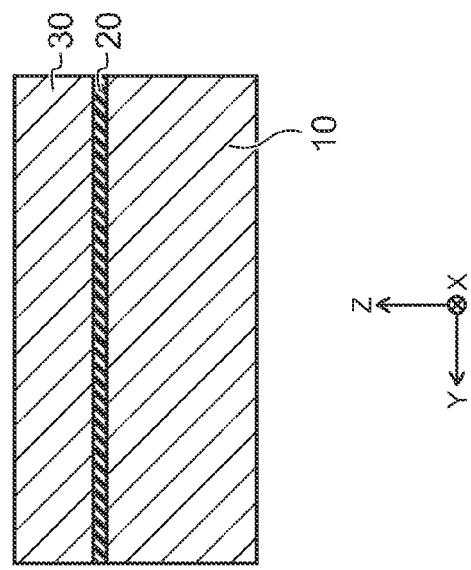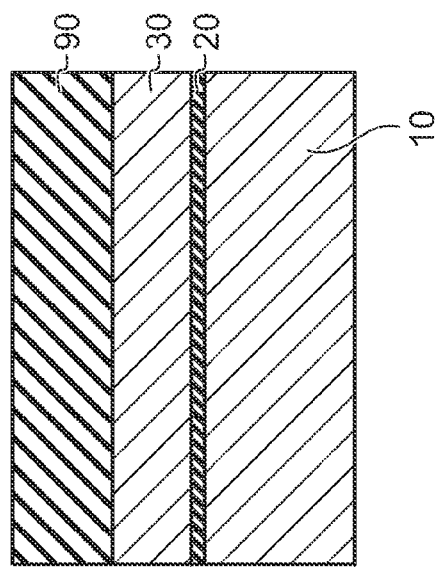

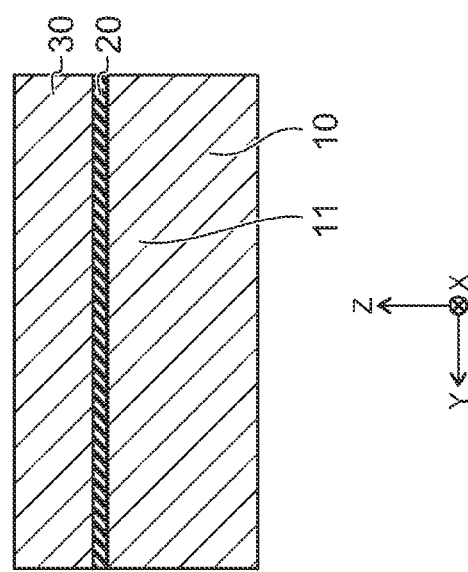
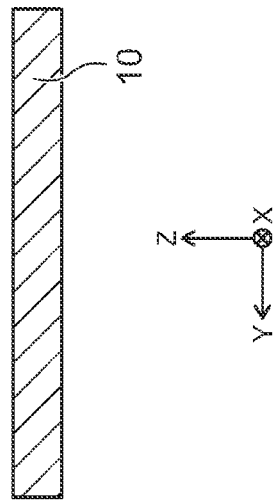
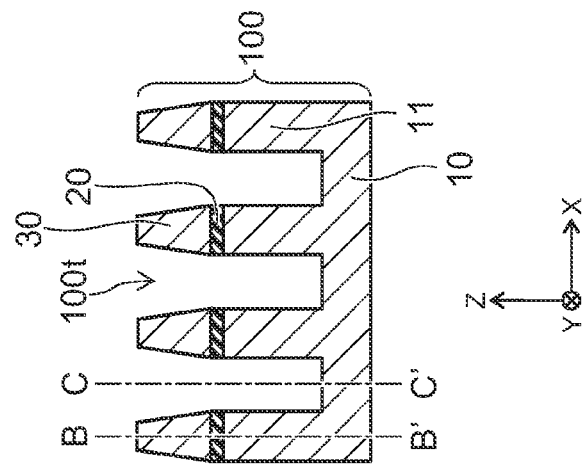

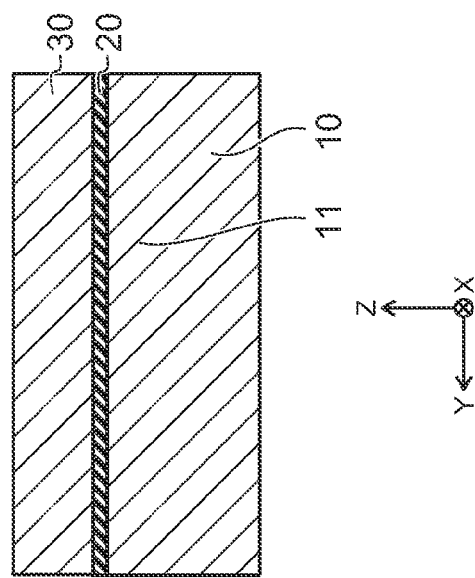
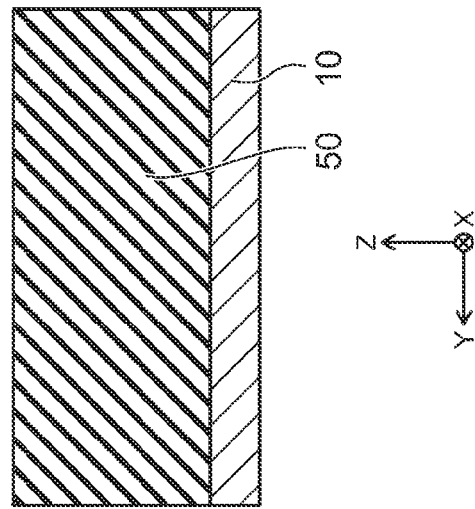
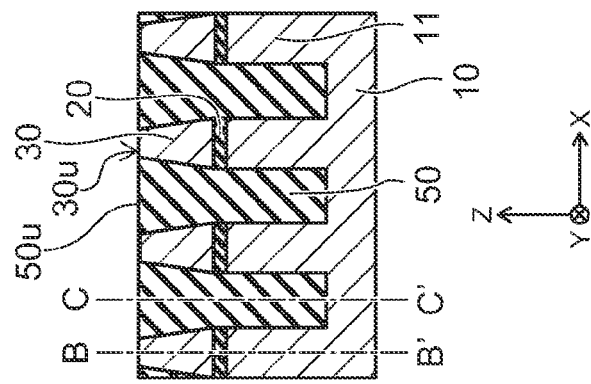

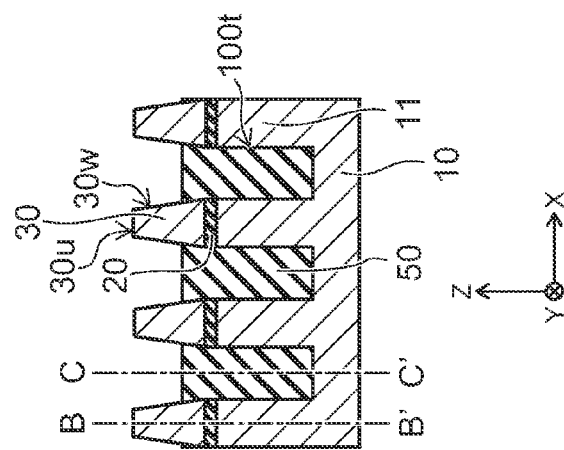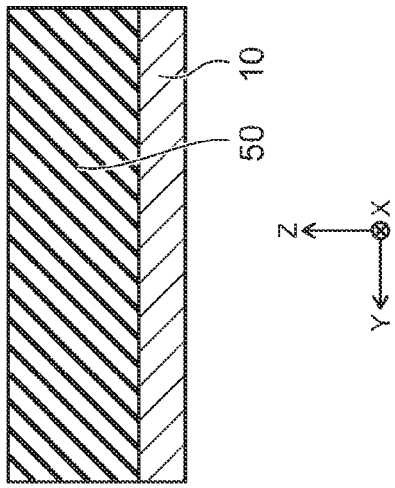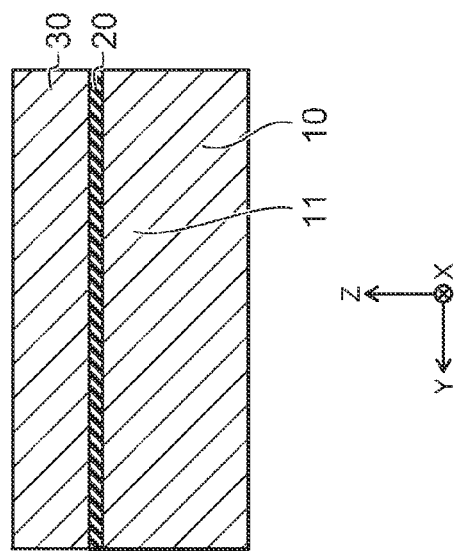

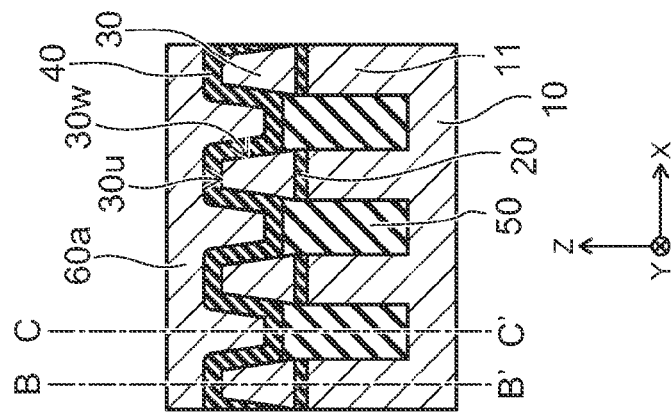
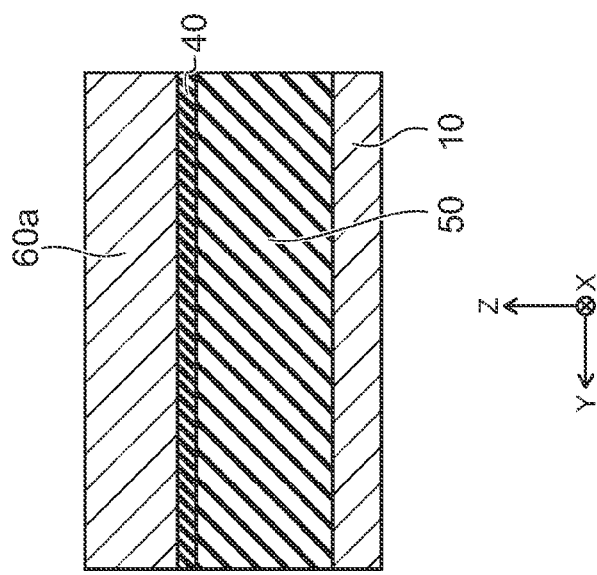
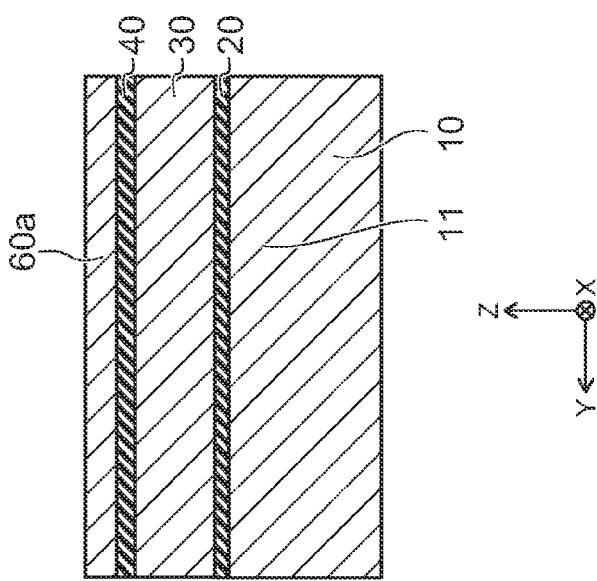

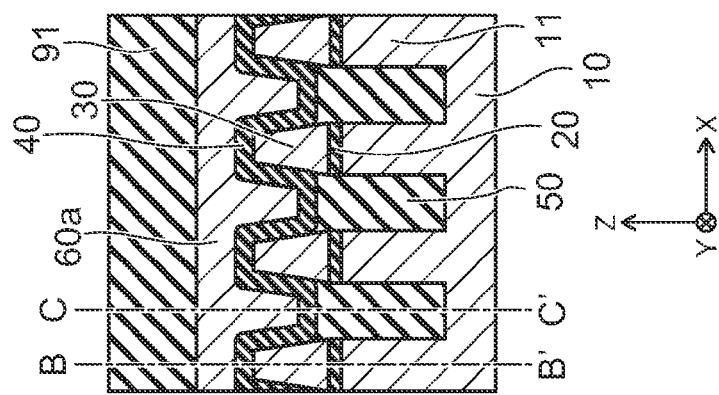
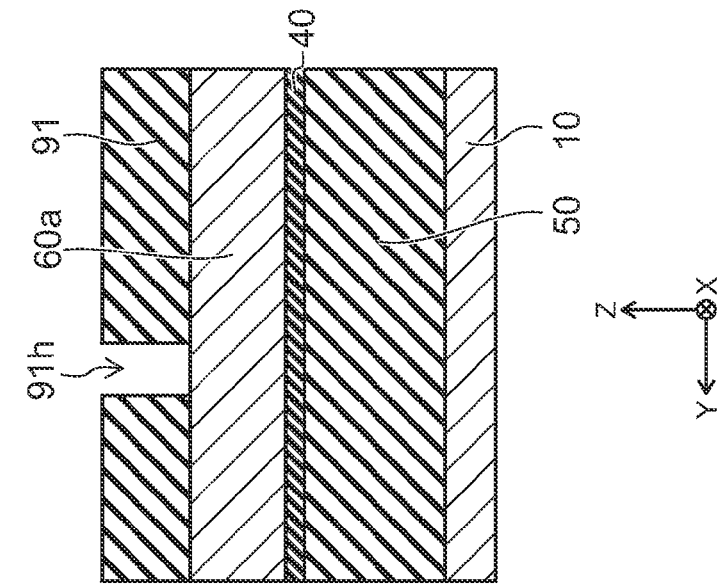
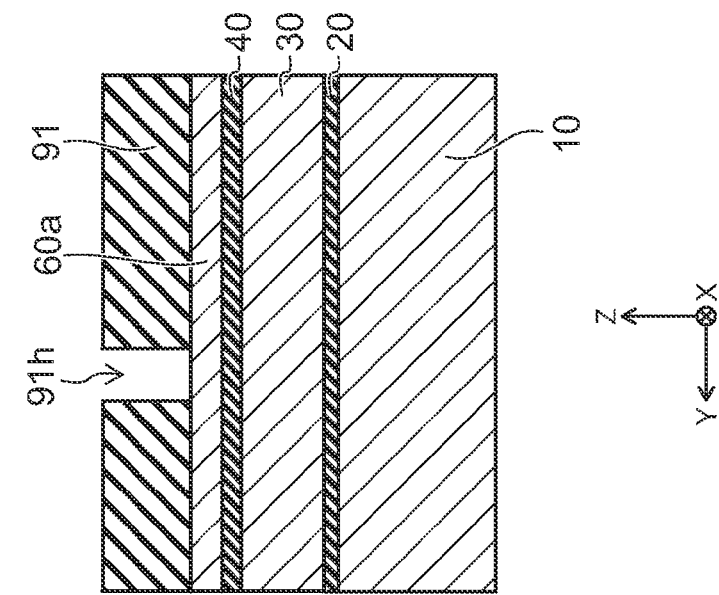

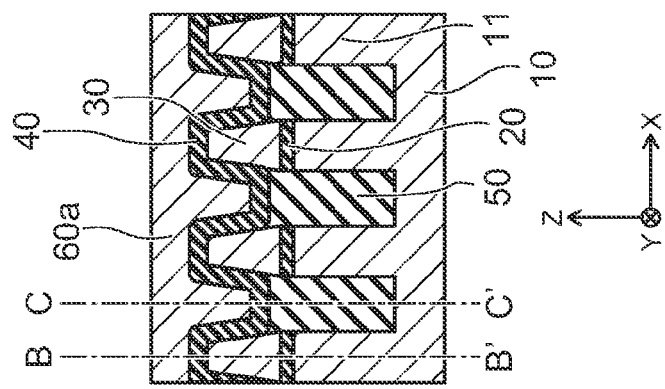
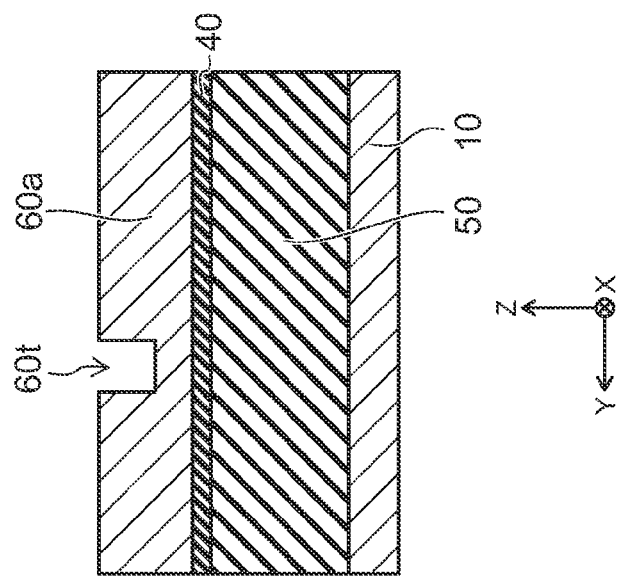
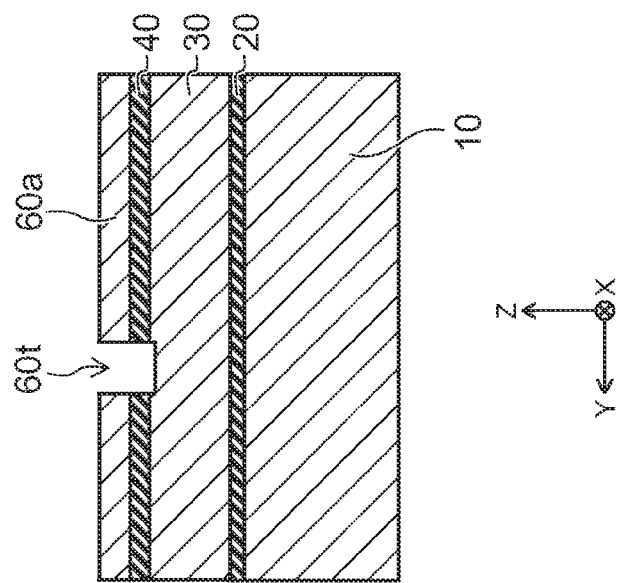

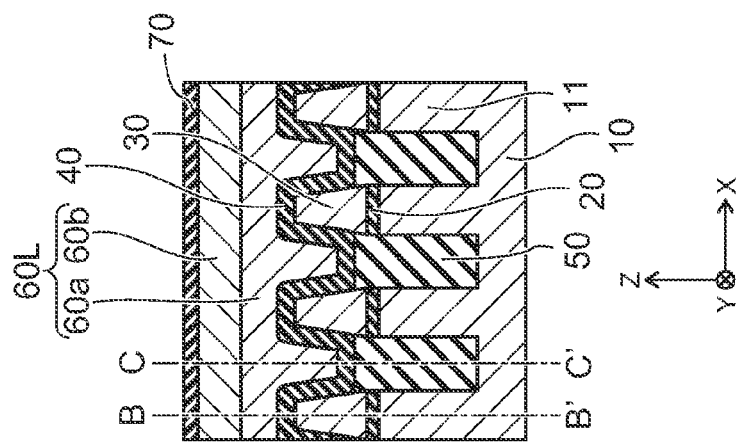
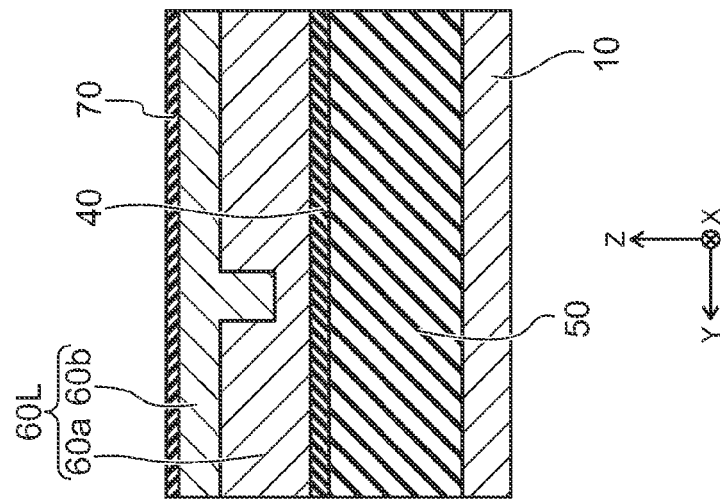
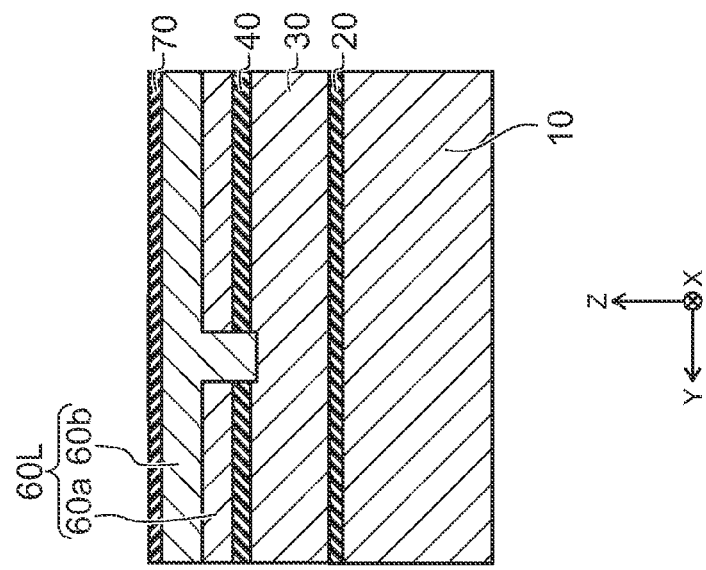

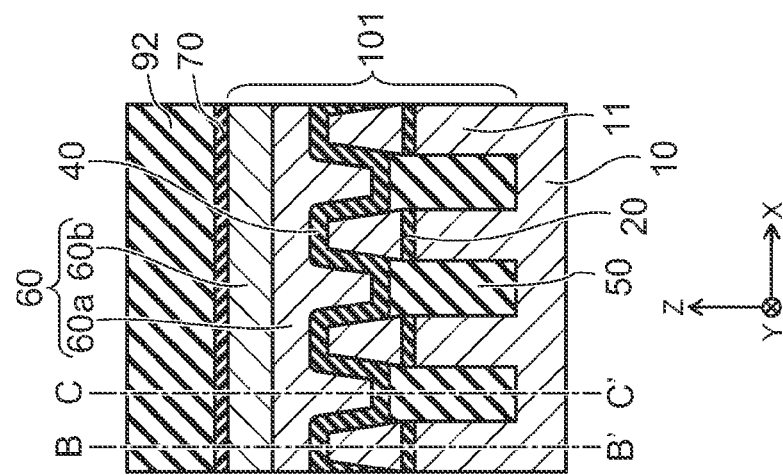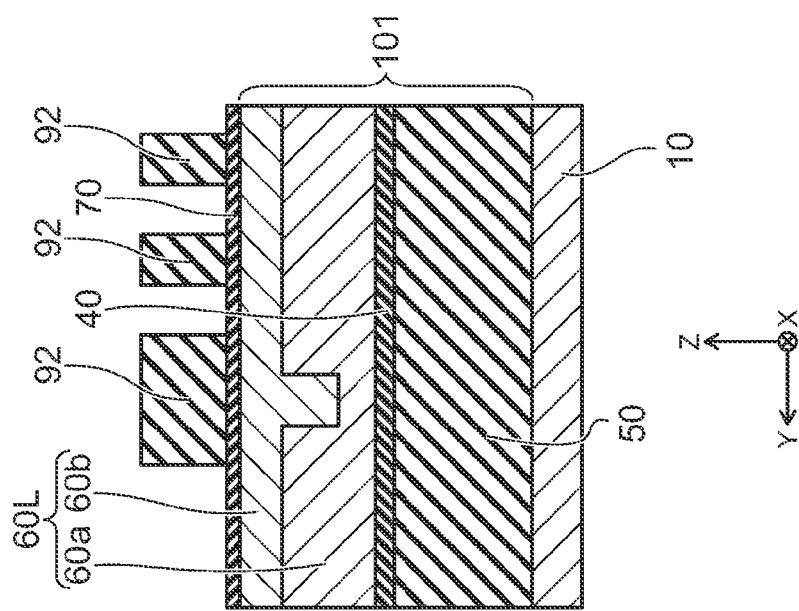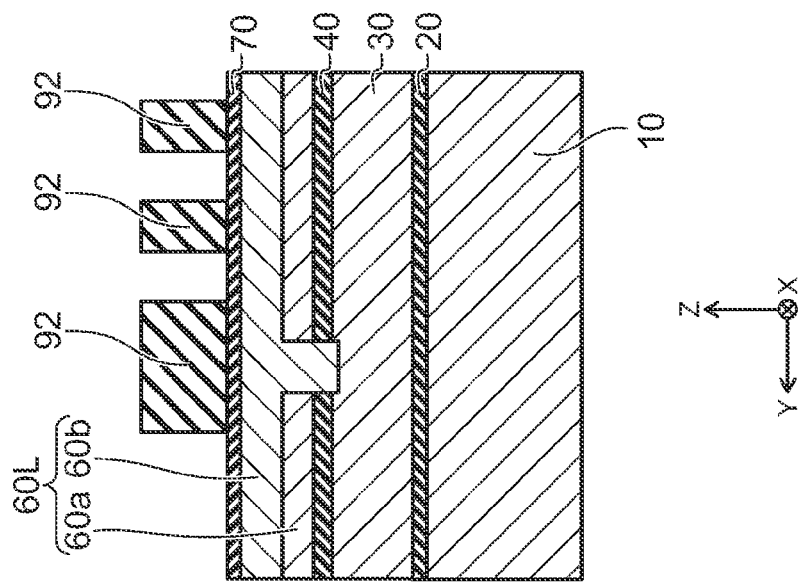

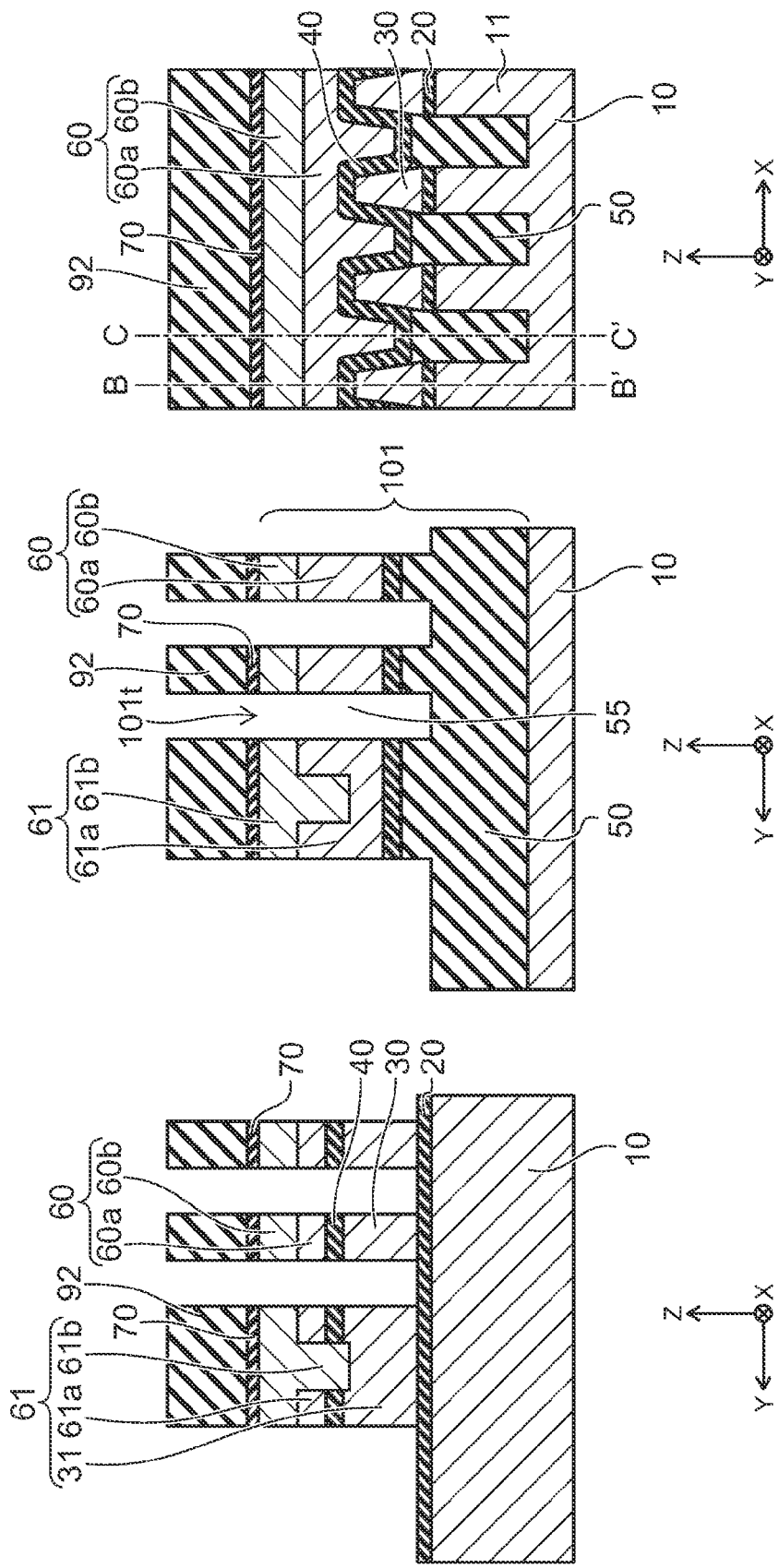

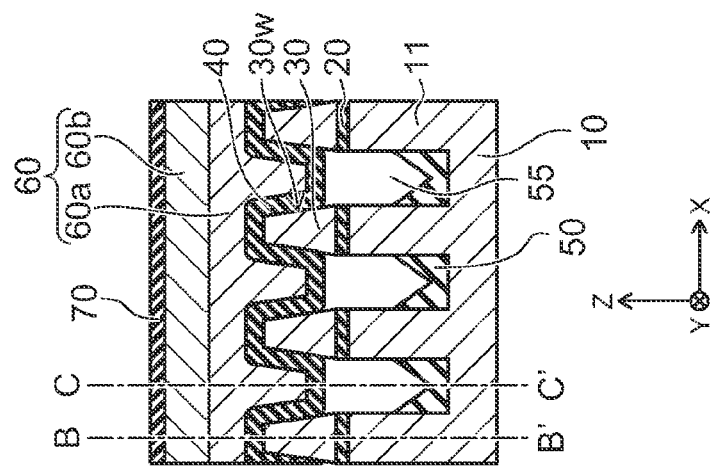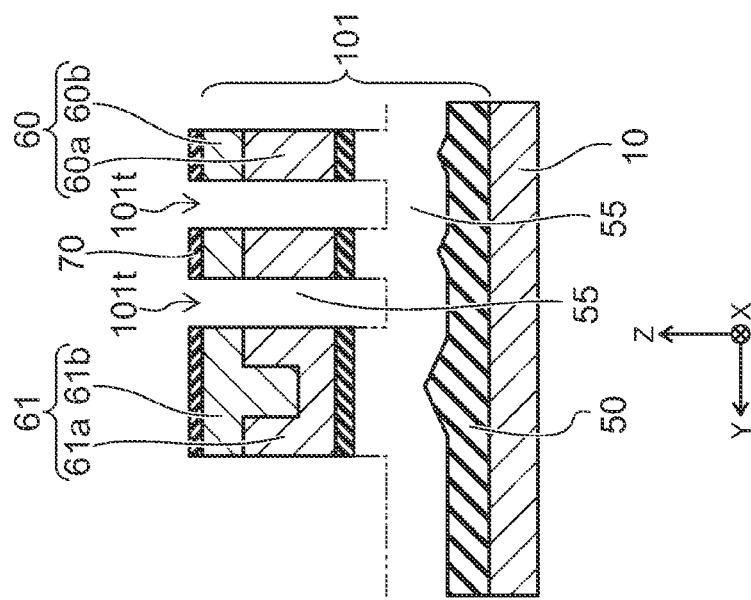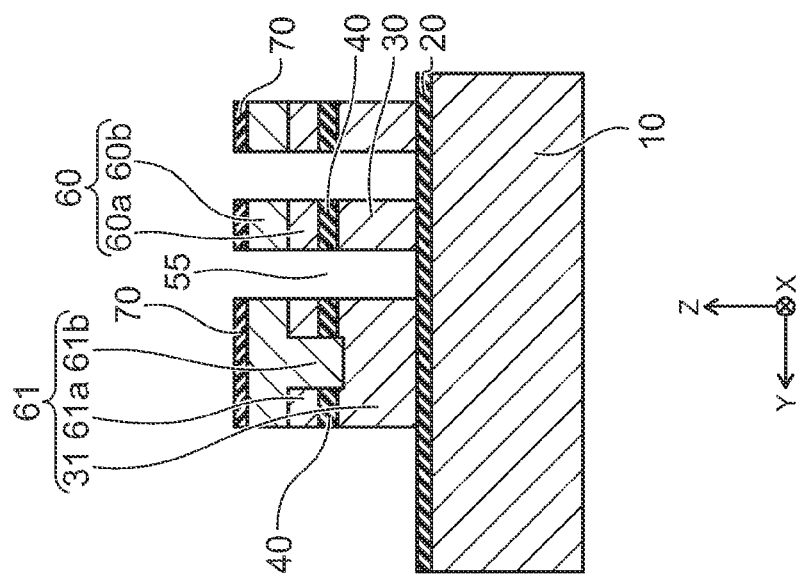

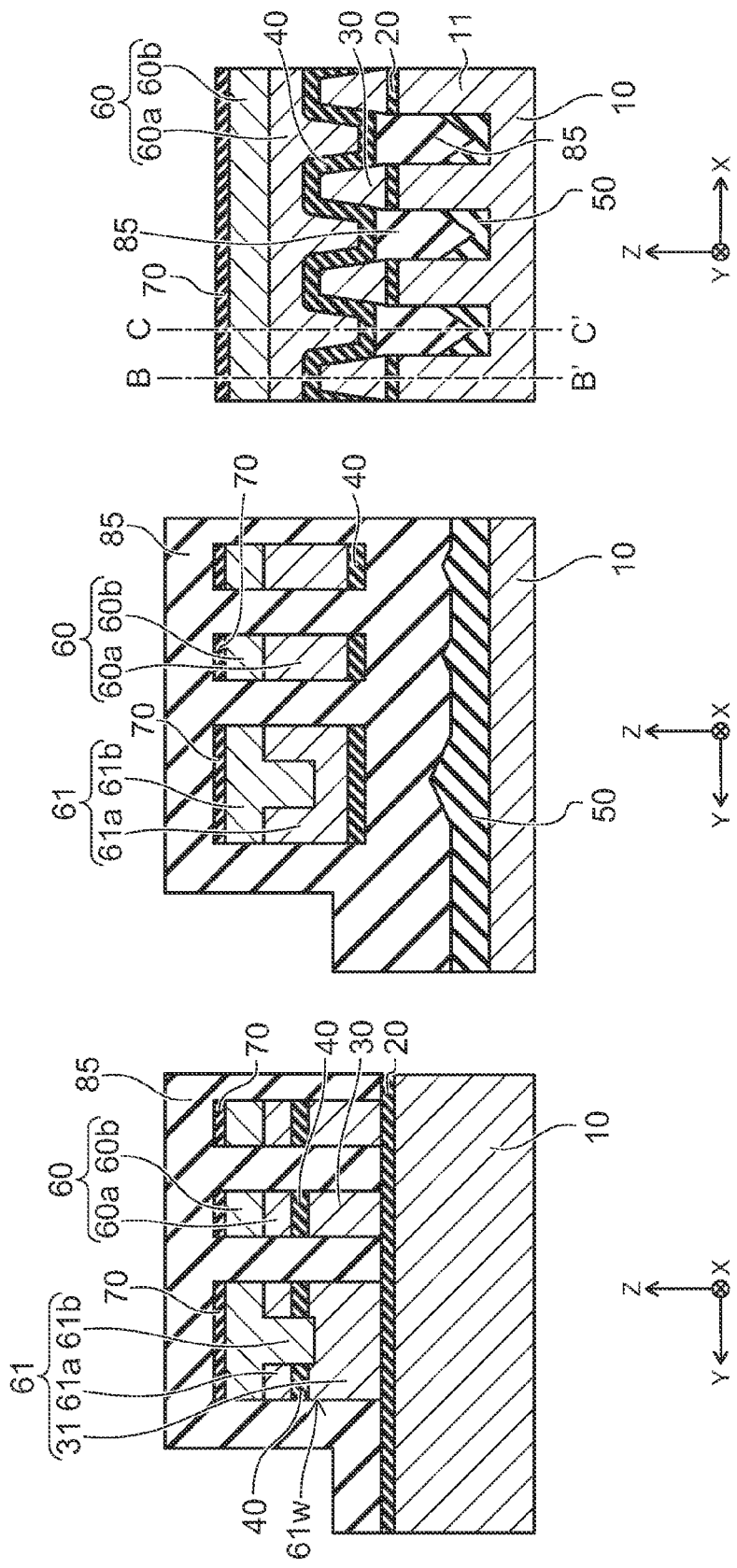

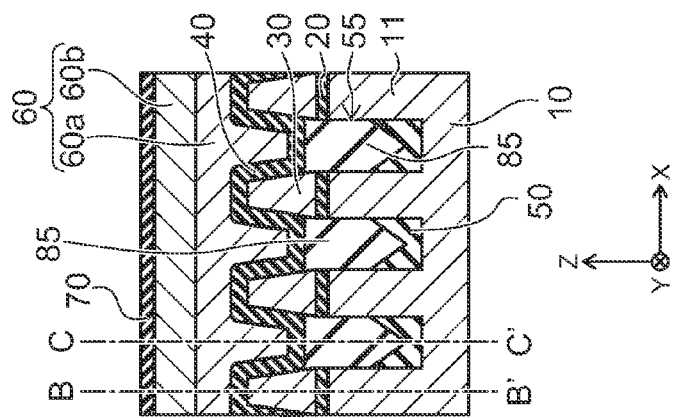
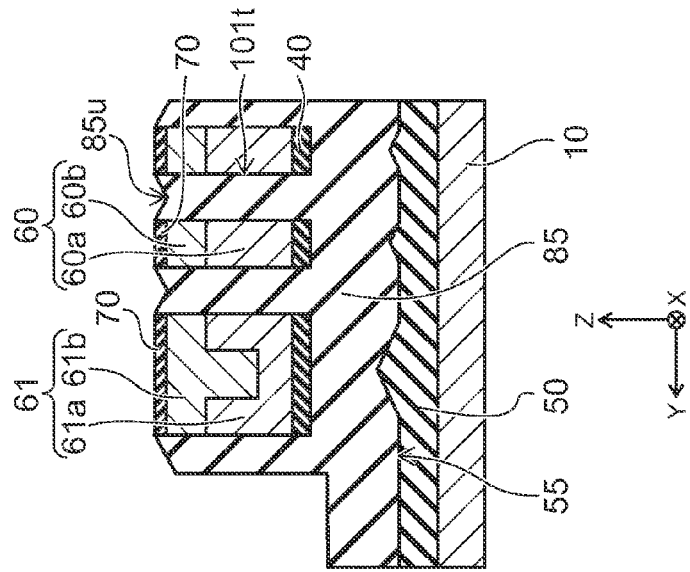
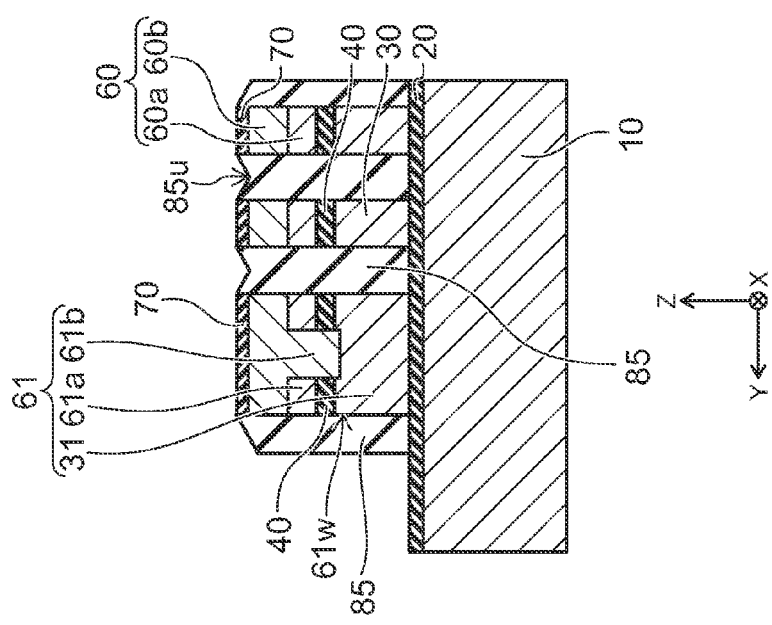

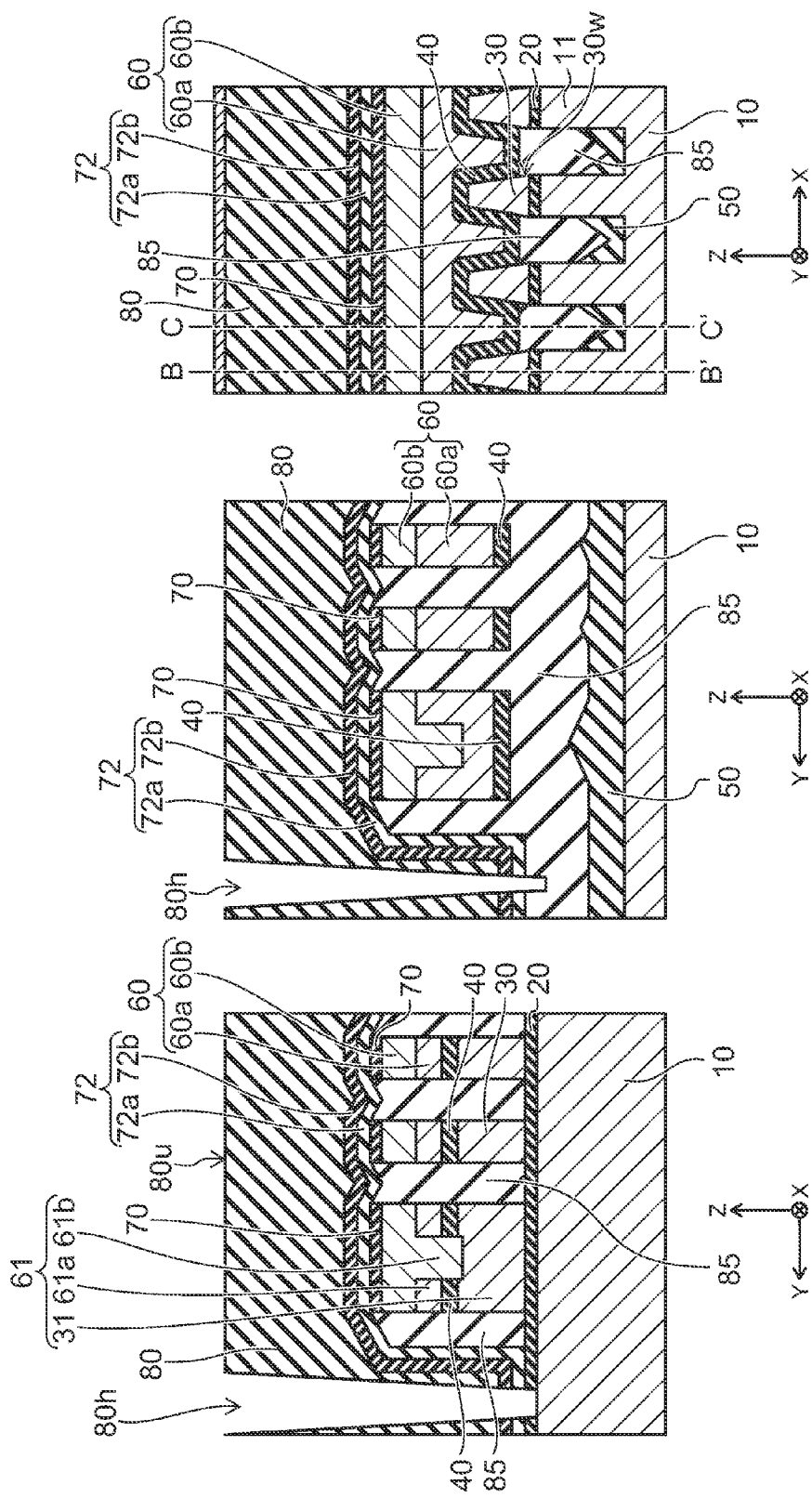

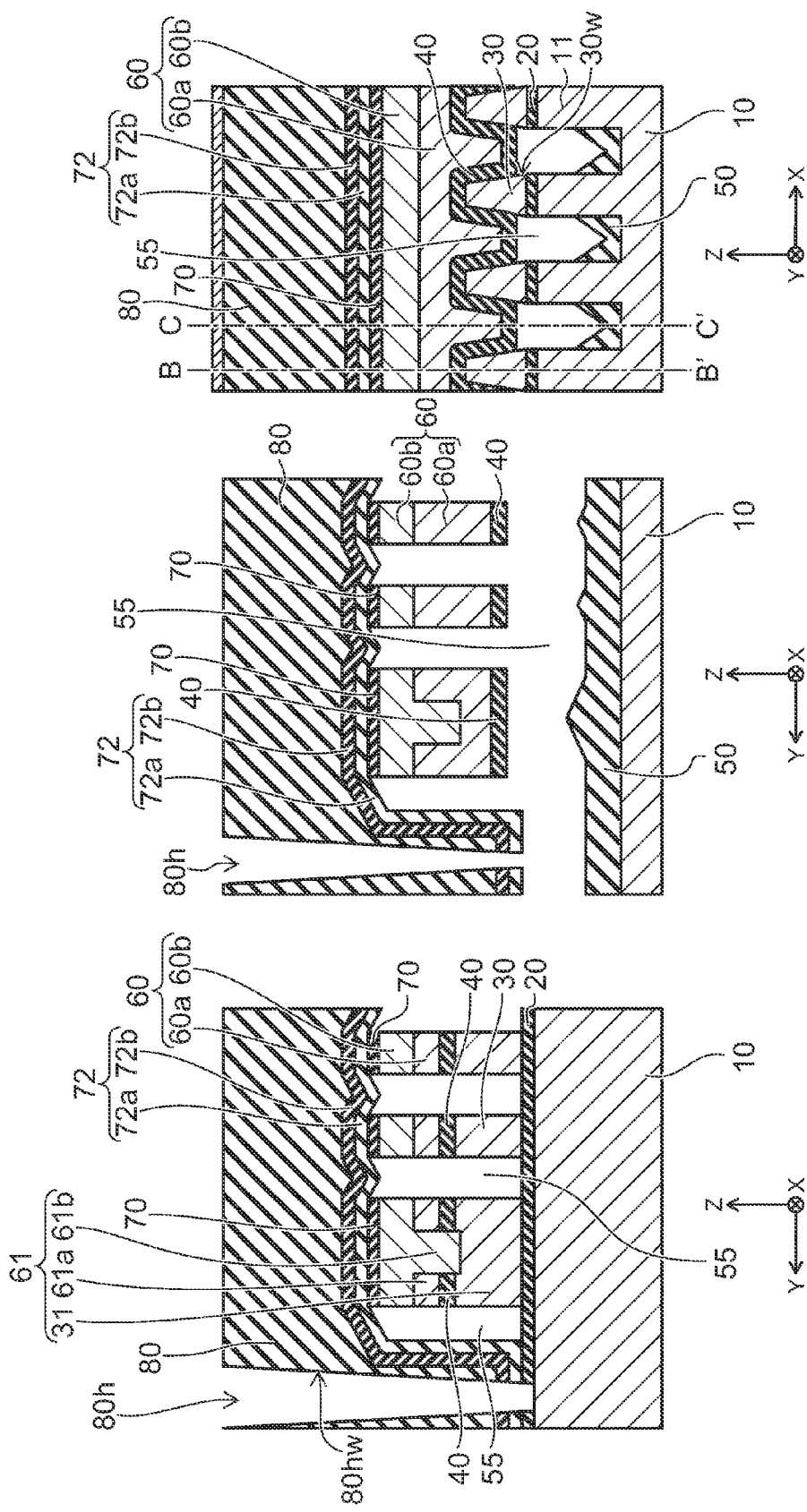

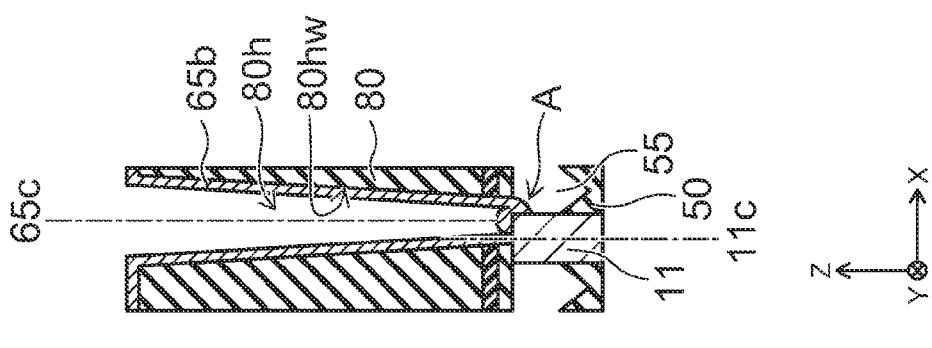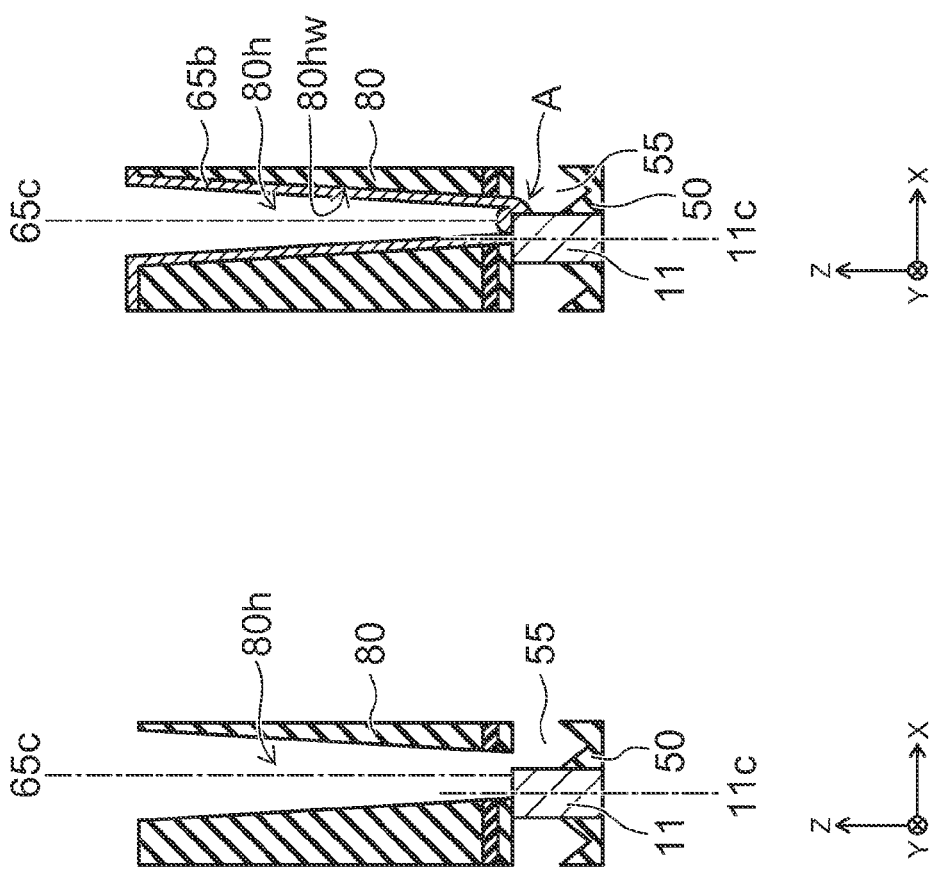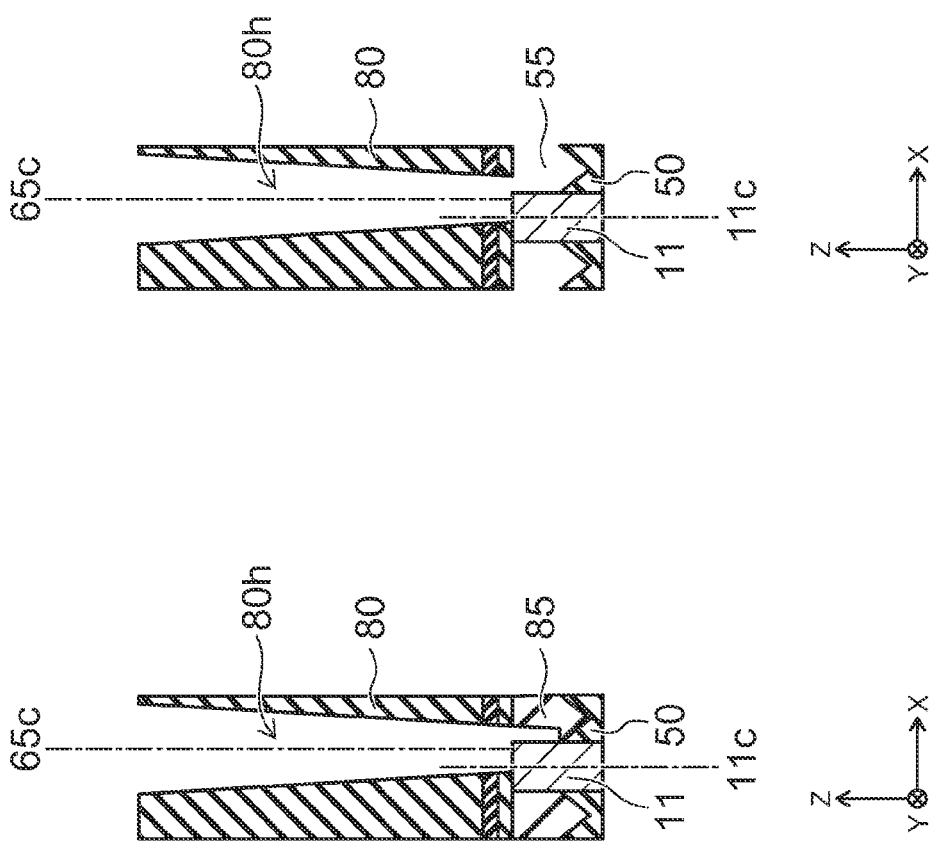

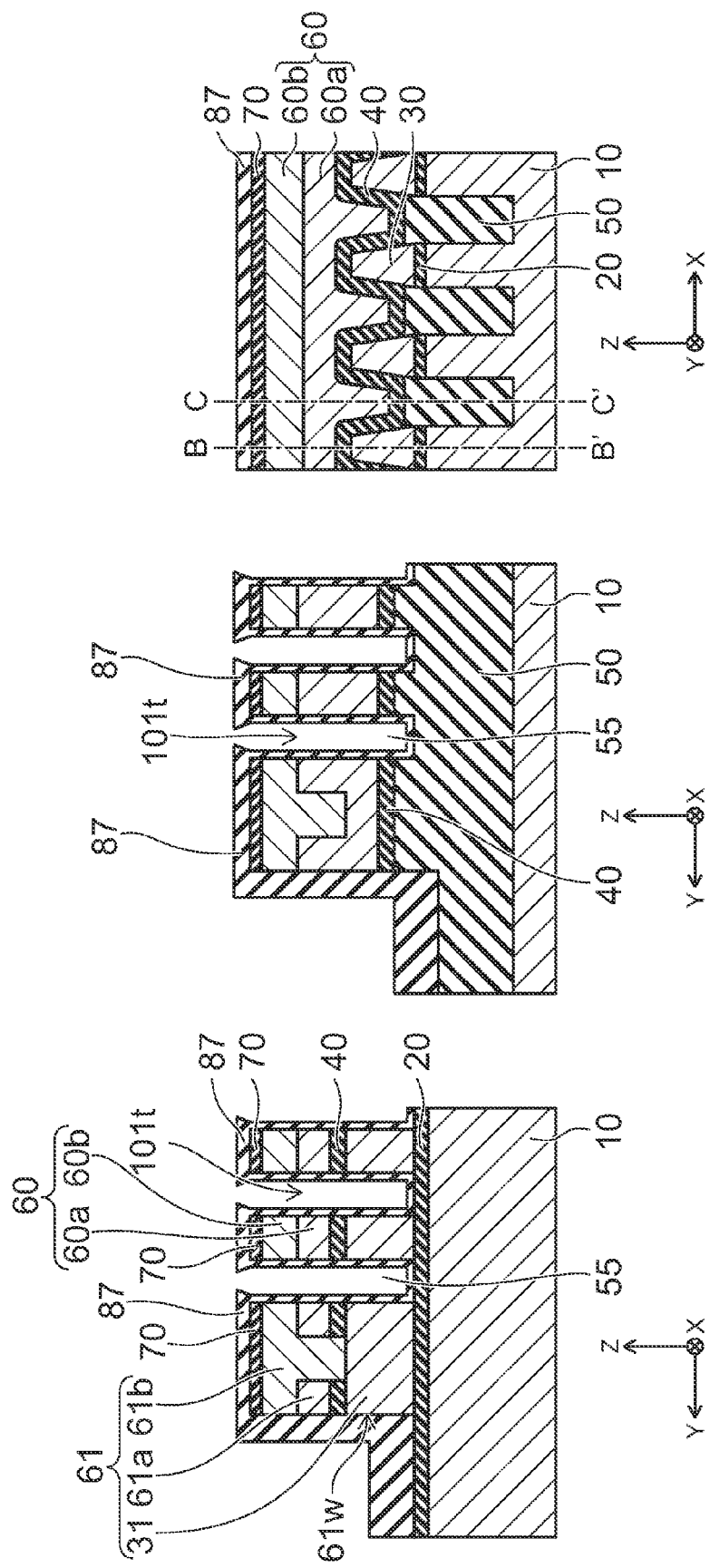

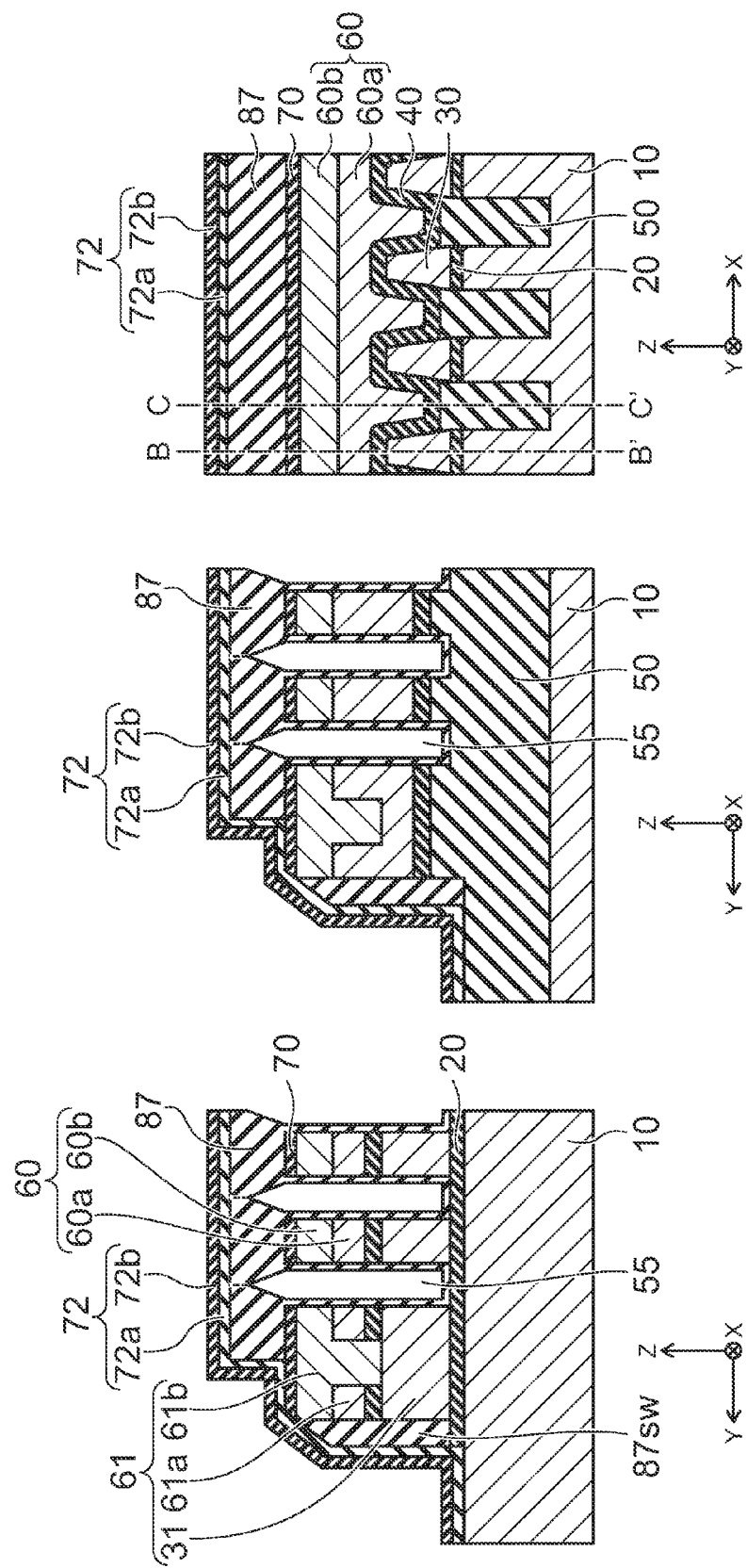

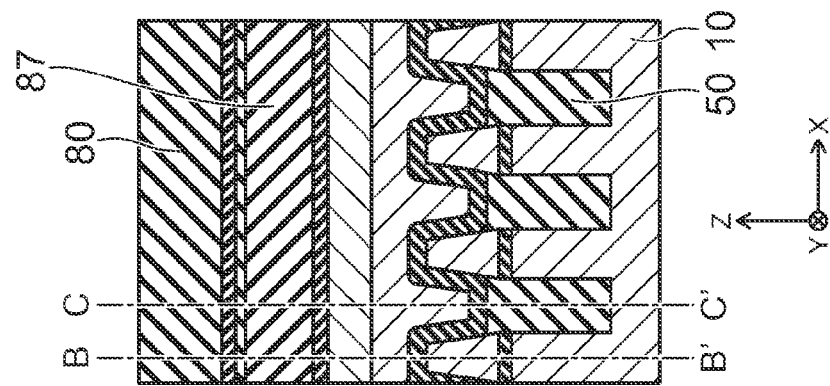
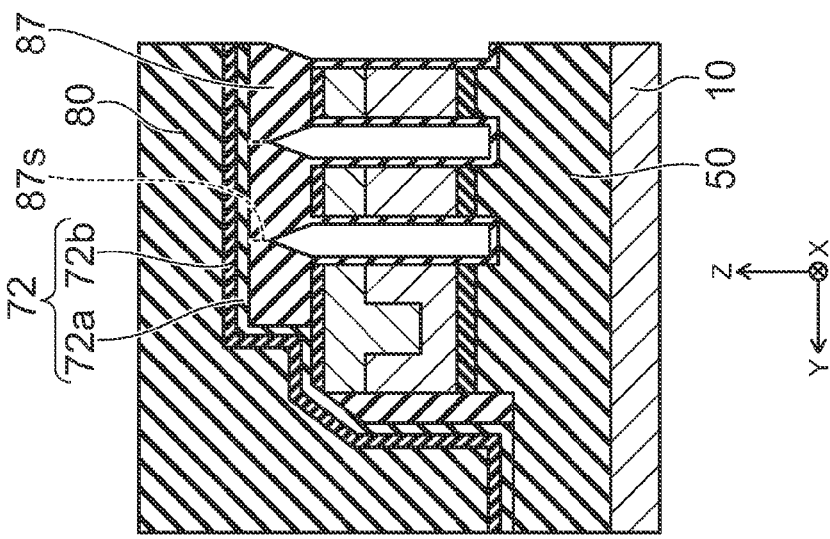
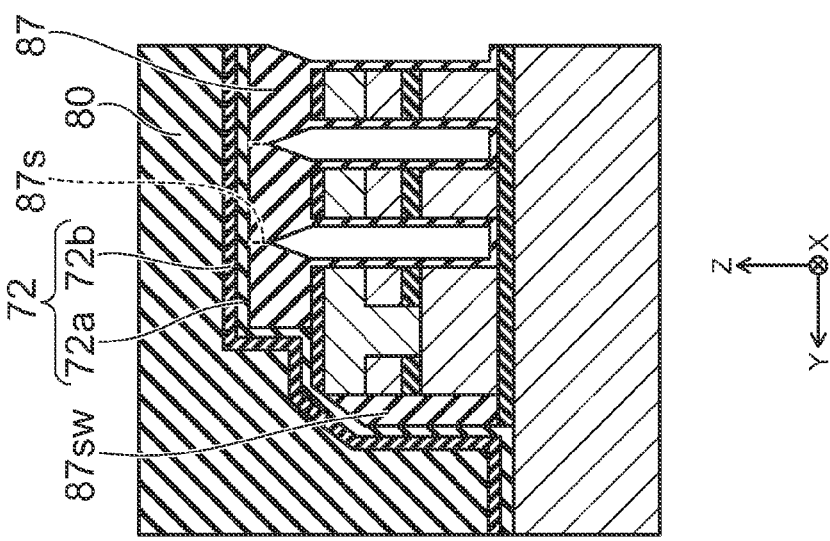

US 9,070,746 B2

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from Japanese Patent Application No. 2013-156523, filed on Jul. 29, 2013; the entire contents of which are incorporated herein by reference.

FIELD

Embodiments described herein relate generally to a nonvolatile semiconductor memory device and a method for manufacturing the same.

BACKGROUND

In nonvolatile semiconductor memory devices typified by a NAND flash memory, the increasing of the memory capacity is achieved by the miniaturization of memory cells and the shortening of the pitch of memory cells. However, with the miniaturization and the pitch shortening, the electrical interference between memory cells is becoming significant.

As a method to suppress the interference between memory cells, there is air gap technology. This is a technology in which, when an insulating layer is formed between memory cells, a space is left in the insulating layer. Thereby, the parasitic capacitance between memory cells is reduced to suppress the electrical interference between memory cells.

However, in the insulating layer in which a space is left, a narrow gap of what is called a seam may be formed. If such a seam is formed in the insulating layer, a chemical liquid or an electrode material provided on the upper side of the memory cell may go through the seam to get between memory cells during processes. In such a case, the reliability of the nonvolatile semiconductor memory device is reduced.

BRIEF DESCRIPTION OF THE DRAWINGS

FIG. 4A to FIG. 20C are schematic cross-sectional views showing the manufacturing process of the nonvolatile semiconductor memory device according to the embodiment;

FIG. 21A to FIG. 21C are schematic cross-sectional views showing the manufacturing process of the nonvolatile semiconductor memory device according to the embodiment; and FIG. 22A to FIG. 27C are schematic cross-sectional views showing the manufacturing process of the nonvolatile semiconductor memory device according to the reference example.

DETAILED DESCRIPTION

Figure 1:
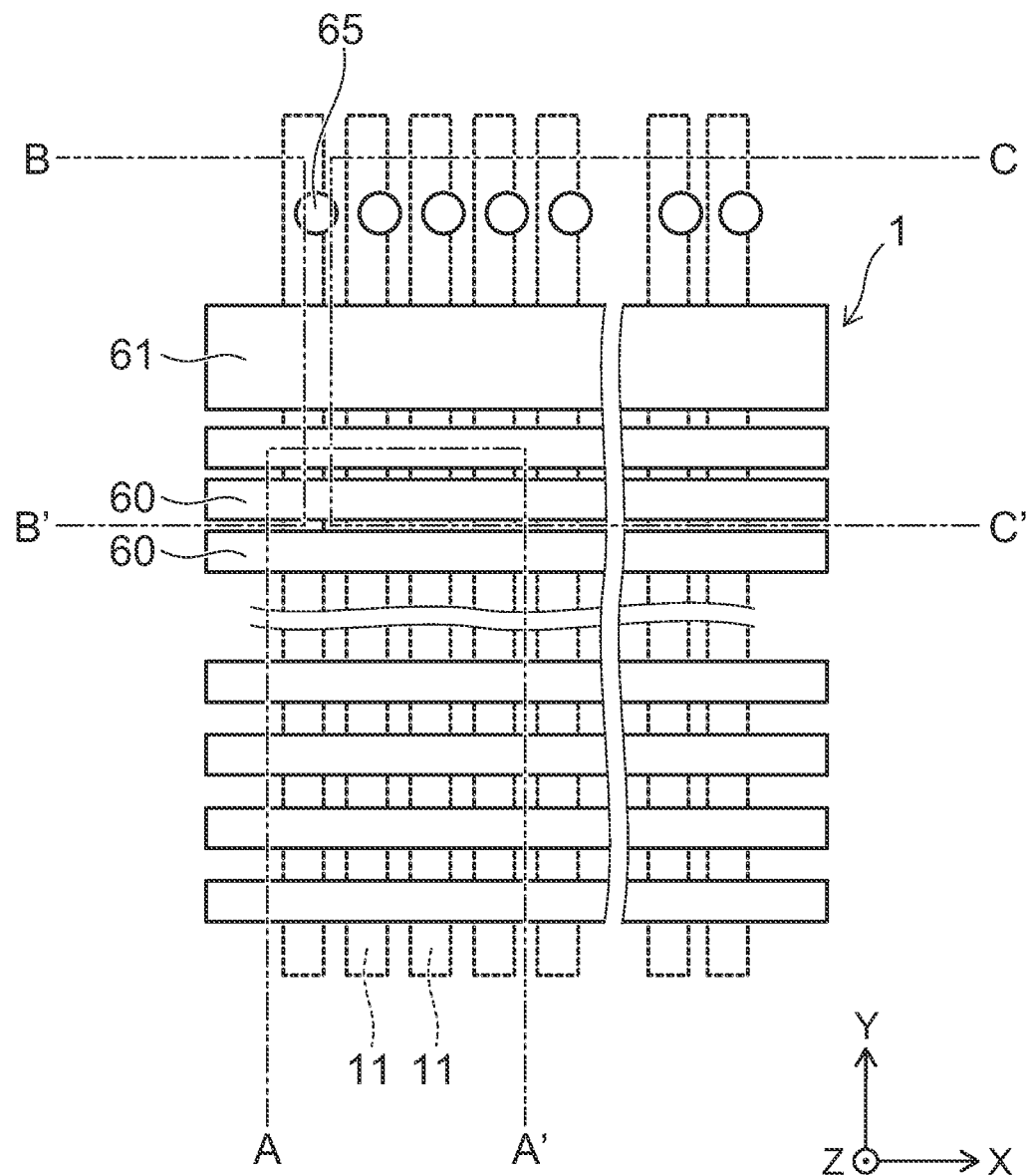
FIG. 1 is a schematic plan view showing a nonvolatile semiconductor memory device according to an embodiment.

In general, according to one embodiment, a nonvolatile semiconductor memory device includes: a plurality of first semiconductor regions extending in the first direction and arranged each via a space in a direction crossing the first direction; a plurality of control gate electrodes provided on an upper side of the plurality of first semiconductor regions, the plurality of control gate electrodes extending in a second direction different from the first direction, and the plurality of control gate electrodes arranged each via the space in a direction crossing the second direction; a select gate electrode provided on an upper side of the plurality of first semiconductor regions, the select gate electrode extending in the second direction, and the select gate electrode aligned with a control gate electrode located on an outermost side out of the plurality of control gate electrodes via the space; a charge storage layer provided at a crossing position of each of the plurality of first semiconductor regions and each of the plurality of control gate electrodes cross each other, and part of a side wall of the charge storage layer being exposed at the space between adjacent ones of the plurality of first semiconductor regions; and a first insulating layer covering the plurality of control gate electrodes and the select gate electrode, the first insulating layer provided on a side wall of the select gate electrode via the space, and a portion of the first insulating layer bridged between adjacent ones of the plurality of control gate electrodes protruding toward the space between adjacent ones of the plurality of control gate electrodes.

Hereinbelow, embodiments are described with reference to the drawings. In the following description, identical components are marked with the same reference numerals, and a description of components once described is omitted as appropriate.

FIG. 1 is a schematic plan view showing a nonvolatile semiconductor memory device according to an embodiment.

FIG. 1 shows a planar layout of a memory cell portion of a NAND flash memory.

A nonvolatile semiconductor memory device 1 according to a first embodiment includes a plurality of semiconductor regions 11 (first semiconductor regions), a plurality of control gate electrodes 60, a select gate electrode 61, and conductive layers 65.

Each of the plurality of semiconductor regions 11 extends in the Y-direction (a first direction), and the plurality of semiconductor regions 11 extending in the Y-direction are arranged in a direction (for example, the X-direction is taken) crossing the Y-direction.

The plurality of control gate electrodes 60 extend in the X-direction (a second direction) different from the Y-direction, and are arranged in a direction (for example, the Y-direction is taken) crossing the X-direction. The select gate electrode 61 is aligned with the control gate electrode 60 located on the outermost side out of the plurality of control gate electrodes 60 shown in FIG. 1. The select gate electrode 61 extends in the X-direction. The X-direction and the Y-direction are orthogonal, for example.

The plurality of control gate electrodes 60 and the select gate electrode 61 are provided on the upper side of the plurality of semiconductor regions 11. That is, in the nonvolatile semiconductor memory device 1, each of the plurality of semiconductor regions 11 and the select gate electrode 61, and each of the plurality of control gate electrodes 60 cross each other.

The conductive layer 65 is a contact electrode (described later). FIG. 1 shows, as an example, a state where the plurality of conductive layers 65 are not shifted from one another in the Y-direction but aligned rectilinearly in the X-direction. The position of each of the plurality of conductive layers 65 may be shifted in the Y-direction.

In the nonvolatile semiconductor memory device 1, a transistor is disposed in a position where each of the plurality of semiconductor regions 11 and each of the plurality of control gate electrodes 60 cross each other (described later). The transistors are arranged two-dimensionally in the X-Y plane. Each transistor functions as a memory cell of the nonvolatile semiconductor memory device 1.

Each of the plurality of semiconductor regions 11 and the select gate electrode 61 constitutes part of a NAND string. The select gate electrode 61 is one select gate electrode of the NAND string. Each of the plurality of semiconductor regions 11 is element-isolated. The control gate electrode 60 may be referred to as a word line.

Figure 2:
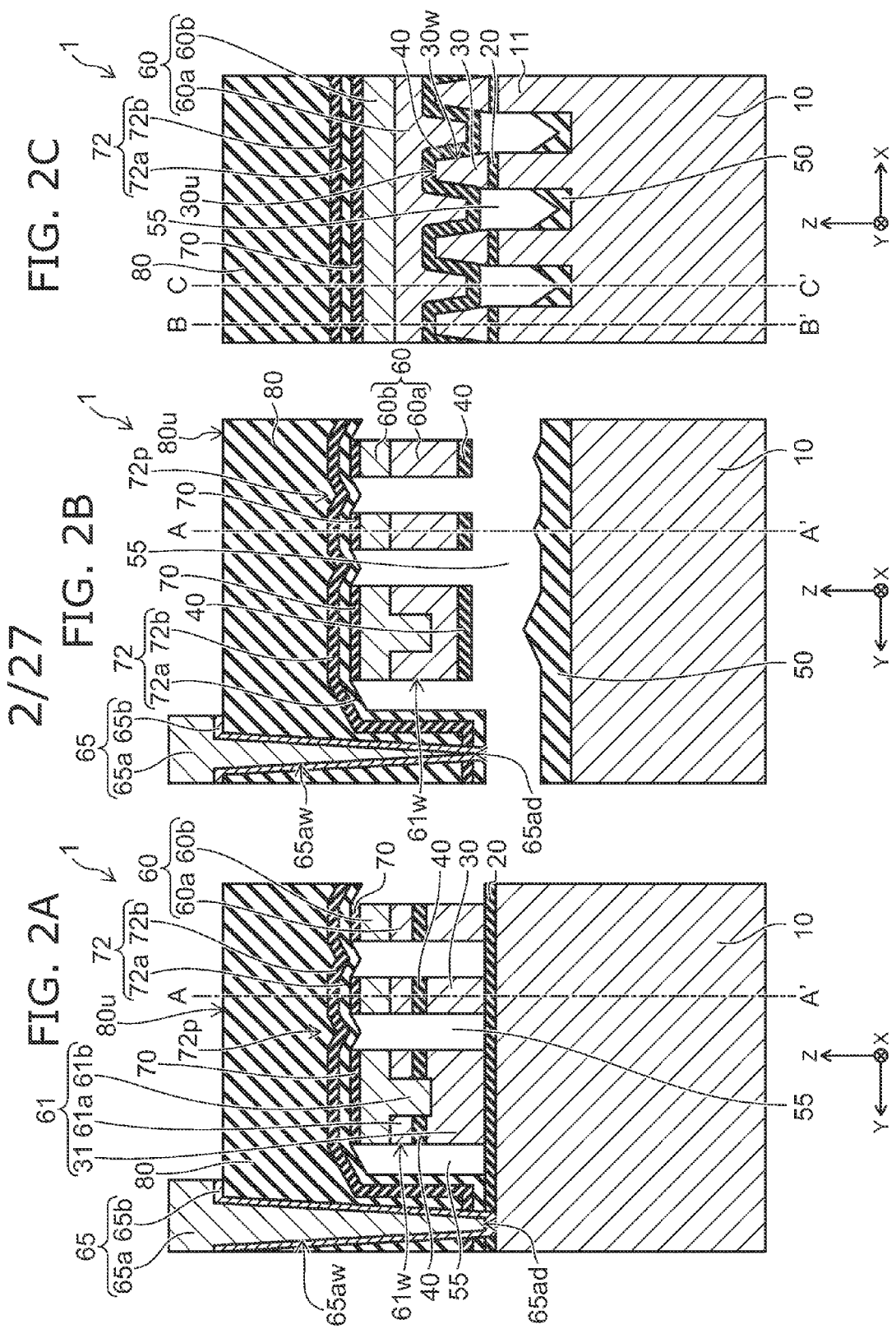
FIG. 2A to FIG. 2C are schematic cross-sectional views showing the nonvolatile semiconductor memory device according to the embodiment.

FIG. 2A to FIG. 2C are schematic cross-sectional views showing the nonvolatile semiconductor memory device according to the embodiment.

Here, FIG. 2A is a schematic cross-sectional view of the nonvolatile semiconductor memory device taken along line B-B' of FIG. 1, FIG. 2B is a schematic cross-sectional view of the nonvolatile semiconductor memory device taken along line C-C of FIG. 1, and FIG. 2C is a schematic cross-sectional view of the nonvolatile semiconductor memory device taken along line A-A' of FIG. 1.

In the embodiment, the structure and the manufacturing method of the nonvolatile semiconductor memory device 1 are described using the cross-sectional views taken along line A-A', line B-B', and line C-C' of FIG. 1.

The nonvolatile semiconductor memory device 1 includes a gate insulating film 20 (a second insulating film), a charge storage layer 30, a gate insulating film 40 (a first insulating film), and an element isolation region 50, in addition to the semiconductor region 11, the control gate electrode 60, and the select gate electrode 61.

The nonvolatile semiconductor memory device 1 includes a transistor that includes the semiconductor region 11, the gate insulating film 20, the charge storage layer 30, the gate insulating film 40, and the control gate electrode 60. The nonvolatile semiconductor memory device 1 includes a transistor that includes the semiconductor region 11, the gate insulating film 20, and the select gate electrode 61.

Each of the plurality of semiconductor regions 11 is partitioned by the element isolation region 50 and a space 55 in a semiconductor layer 10 in the line A-A' cross section (FIG. 2C). For example, each of the plurality of semiconductor regions 11 extending in the Y-direction is partitioned by the element isolation region 50 and the space 55 in the semiconductor layer 10. The plurality of semiconductor regions 11 are arranged via spaces 55 in the X-direction. Each of the plurality of semiconductor regions 11 is an active area that the transistor of the nonvolatile semiconductor memory device 1 occupies.

The gate insulating film 20 is provided between each of the plurality of semiconductor regions 11 and the charge storage layer 30 (FIGS. 2A and 2B). The gate insulating film 20 is provided between the semiconductor region 11 and the select gate electrode 61. The gate insulating film 20 functions as a tunnel insulating film (a TNL insulating film) that allows a charge (e.g. electrons) to tunnel between the semiconductor region 11 and the charge storage layer 30.

The charge storage layer 30 is provided in a position where each of the plurality of semiconductor regions 11 and each of the plurality of control gate electrodes 60 cross each other (FIGS. 2A and 2B). The charge storage layer 30 is provided on the gate insulating film 20. In the line B-B' cross section, the space 55 is present between charge storage layers 30 (FIG. 2A). In the line A-A' cross section, the control gate electrode 60, the gate insulating film 40, and the space 55 are present between charge storage layers 30 (FIG. 2C). In other words, part of the side wall 30w of the charge storage layer 30 is exposed at the space 55 between adjacent semiconductor regions 11.

The charge storage layer 30 can store a charge that has tunneled from the semiconductor region 11 via the gate insulating film 20. The charge storage layer 30 is a floating gate in the nonvolatile semiconductor memory device 1. In the line A-A' cross section and the line B-B' cross section, the cross-sectional shape of the charge storage layer 30 is a rectangle, for example (FIGS. 2A and 2B). In other words, the external shape of the charge storage layer 30 is a columnar shape extending in the Z-direction. A portion that includes the charge storage layer 30 and a portion of the control gate electrode 60 provided on the charge storage layer 30 is referred to as a memory cell.

The gate insulating film 40 is provided between each of the plurality of control gate electrodes 60 and the charge storage layer 30 (FIGS. 2A and 2B). In the line A-A' cross section, the gate insulating film 40 covers the top 30u of the charge storage layer 30 and part of the side wall 30w of the charge storage layer 30 (FIG. 2C). For example, the gate insulating film 40 covers portions of the charge storage layer 30 other than the portion where the charge storage layer 30 is exposed at the space 55. Part of the gate insulating film 40 is exposed at the space 55 between adjacent semiconductor regions 11.

The top 30u and part of the side wall 30w of the charge storage layer 30 are covered with the gate insulating film 40, and the charge stored in the charge storage layer 30 is prevented from leaking to the control gate electrode 60. The gate insulating film 40 is referred to as an IPD (inter-poly-dielectric) film or a charge block layer.

The plurality of control gate electrodes 60 are arranged via spaces 55 in the line B-B' cross section (FIGS. 2A and 2B). Here, the control gate electrode 60 is provided on the gate insulating film 40. The control gate electrode 60 functions as a gate electrode for controlling the transistor. In the line A-A' cross section, the control gate electrode 60 covers the top 30u and part of the side wall 30w of the charge storage layer 30 via the gate insulating film 40 (FIG. 2C). Thereby, the area where the charge storage layer 30 is in contact with the control gate electrode 60 via the gate insulating film 40 is increased, and the reliability of writing etc. is improved.

In the line B-B' cross section, the select gate electrode 61 is aligned with the control gate electrode 60 located on the outermost side out of the plurality of control gate electrodes 60 via the space 55. The select gate electrode 61 is provided on the gate insulating film 20 (FIG. 2A). The select gate electrode 61 functions as a gate electrode for controlling the transistor.

An insulating film 70 is provided on each of the plurality of control gate electrodes 60. The insulating film 70 is provided on the select gate electrode 61. The insulating film 70 is what is called a cap layer.

In the nonvolatile semiconductor memory device 1, the plurality of control gate electrodes 60 and the select gate electrode 61 are covered with an insulating layer 72 (a first insulating layer). The insulating layer 72 includes an insulating layer 72a and an insulating layer 72b provided on the insulating layer 72a. The insulating layer 72 is provided on the side wall 61w of the select gate electrode 61 via the space 55.

In the insulating layer 72, a portion 72p provided like a bridge between control gate electrodes 60 protrudes toward the space 55 between control gate electrodes (FIGS. 2A and 2B). That is, the portion 72p is lowered to the semiconductor layer 10 side between control gate electrodes. In the embodiment, the cross-sectional shape of the portion 72p is not limited to the shape illustrated, and may be flat between control gate electrodes, for example.

In the nonvolatile semiconductor memory device 1, the element isolation region 50 is provided between semiconductor regions 11 (FIG. 2C). An interlayer insulating film 80 is provided on the insulating layer 72.

The nonvolatile semiconductor memory device 1 has the space 55. This is in order to reduce the parasitic capacitance between memory cells. The spaces 55 shown in FIG. 2A to FIG. 2C are joined to one another.

The nonvolatile semiconductor memory device 1 includes the conductive layer 65. The conductive layer 65 extends from the upper surface 80u of the interlayer insulating film 80 to each of the plurality of semiconductor regions 11. The conductive layer 65 is a contact electrode connected to the semiconductor region 11. The conductive layer 65 is electrically connected to a diffusion region provided in the semiconductor layer 11 adjacent to the select gate electrode 61, for example. The conductive layer 65 includes an electrical conductor 65a and an electrical conductor 65b. For example, the conductive layer 65 includes the electrical conductor 65a and the electrical conductor 65b that is provided on the outside of the electrical conductor 65a and in contact with the side wall 65aw and the bottom 65wd of the electrical conductor 65a. The electrical conductor 65a is in contact with none of the plurality of semiconductor regions 11. The electrical conductor 65a is electrically connected to each of the plurality of semiconductor regions 11 via the electrical conductor 65b.

Figure 3:
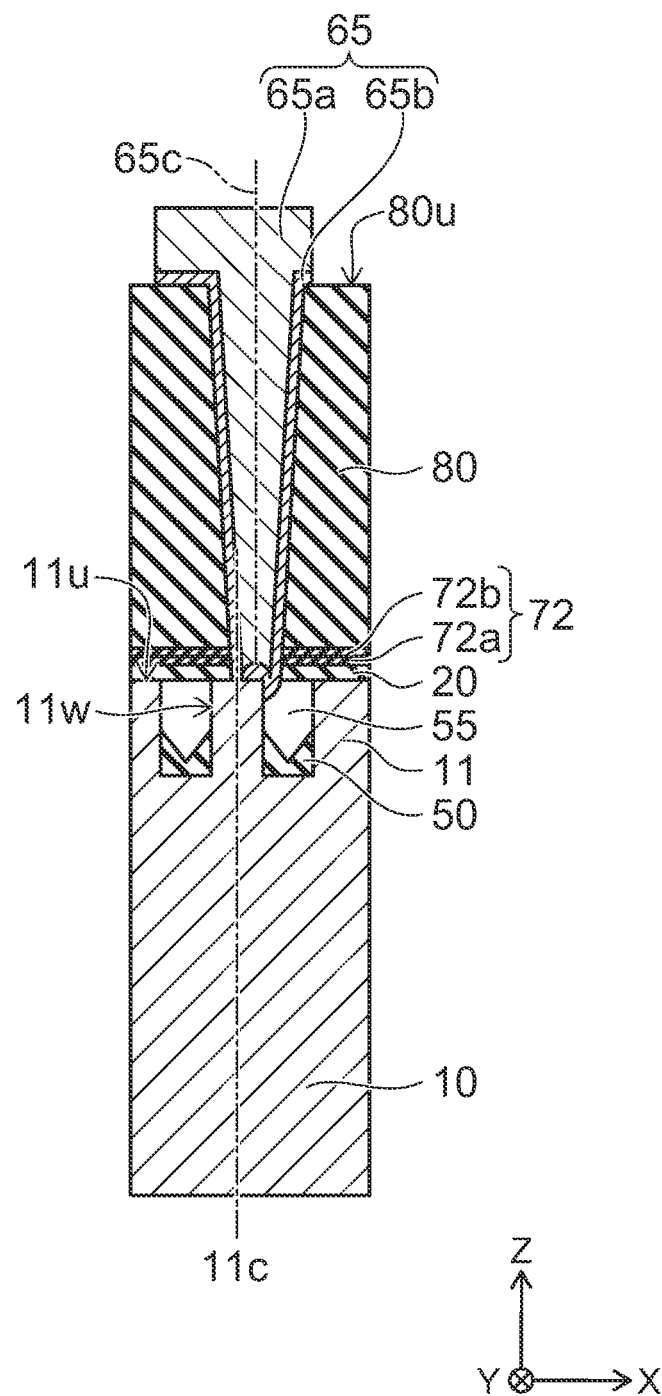
FIG. 3 is a schematic cross-sectional view showing the conductive layer of the nonvolatile semiconductor memory device according to the embodiment.

FIG. 3 is a schematic cross-sectional view showing the conductive layer of the nonvolatile semiconductor memory device according to the embodiment.

FIG. 3 shows a cross section of the conductive layer 65 when the nonvolatile semiconductor memory device is cut along line A-A'.

In the nonvolatile semiconductor memory device 1, the center line 11c of the semiconductor region 11 and the center line 65c of the conductive layer 65 are shifted from each other in the X-direction. The conductive layer 65 is in contact not only with the top 11u of the semiconductor region 11 but also with the side wall 11w of the semiconductor region 11. Thereby, the contact between the semiconductor region 11 and the conductive layer 65 is ensured, and the electrical contact between the semiconductor region 11 and the conductive layer 65 becomes good.

The material of the semiconductor layer 10 (or the semiconductor region 11) is a p-type (a first conductivity type) semiconductor crystal, for example. As the semiconductor, silicon (Si) is given, for example.

The material of the gate insulating film 20 is silicon oxide ($SiO_2$), silicon nitride ($Si_3N_4$), or the like, for example. The gate insulating film 20 may be a single layer of a silicon oxide film or a silicon nitride film, or a film in which either a silicon oxide film or a silicon nitride film is stacked, for example.

The material of the charge storage layer 30 may be a semiconductor material such as Si and a Si-based compound, a material other than these (e.g. a metal or an insulating film), or a stacked film of these, for example. The material of the charge storage layer 30 is a semiconductor containing an n-type (a second conductivity type) impurity, a metal, a metal compound, or the like, for example. As the material, for example, amorphous silicon (a-Si), polysilicon (poly-Si), silicon germanium (SiGe), silicon nitride ($Si_xN_y$), hafnium oxide ($HfO_x$), and the like are given.

The gate insulating film 40 may be a film in which either a silicon oxide film or a silicon nitride film is stacked, for example. For example, the gate insulating film 40 may be what is called an ONO film (silicon oxide film/silicon nitride film/silicon oxide film). Alternatively, the gate insulating film 40 may be a single layer of a silicon nitride film or a silicon oxide film. The gate insulating film 40 may be a metal oxide film or a metal nitride film.

Each of the plurality of control gate electrodes 60 includes a polysilicon-containing layer 60a and a metal-containing layer 60b provided on the polysilicon-containing layer 60a. The polysilicon-containing layer 60a may contain an impurity element.

The metal-containing layer 60b contains tungsten (W). The metal-containing layer 60b may be a single layer of tungsten (W), or a stacked film of tungsten nitride (WN)/tungsten (W) in this order from the lower side, for example. By using a tungsten nitride layer as the lower-side layer of the metal-containing layer 60b, the tungsten nitride layer serves as a barrier layer to suppress the diffusion of silicon from the polysilicon-containing layer 60a to the metal-containing layer 60b. Thereby, the production of tungsten silicide in the metal-containing layer 60b is suppressed, and the metal-containing layer 60b maintains its resistivity.

The select gate electrode 61 includes polysilicon-containing layers 31 and 61a and a metal-containing layer 61b provided on the polusilicon-containing layer 61a. The polysilicon-containing layers 31 and 61a may contain an impurity element. Although the select gate electrode 61 includes the gate insulating film 40, part of the gate insulating film 40 is opened, and the polysilicon-containing layer 31 and the polysilicon-containing layer 61a are electrically connected via the opening.

The metal-containing layer 61b contains tungsten (W). The metal-containing layer 61b may be a single layer of tungsten (W), or a stacked film of tungsten nitride (WN)/tungsten (W) in this order from the lower side, for example. The reason for using the stacked film is as above.

The material of the element isolation region 50 and the interlayer insulating film 80 is silicon oxide ($SiO_2$), for example. The insulating film 70 contains silicon nitride or silicon oxide.

The insulating layer 72a contains silicon oxide or the like, for example. The insulating layer 72b contains silicon nitride or the like, for example.

As the impurity element, for example, boron (B) is given as the p-type impurity, and phosphorus (P) and arsenic (As) are given as the n-type impurity.

The electrical conductor 65a contains tungsten (W) or the like, for example. The electrical conductor 65b contains titanium nitride (TiN), titanium (Ti), or the like, for example. The electrical conductor 65b functions not only as a conductive layer but also as a barrier layer.

The manufacturing process of the nonvolatile semiconductor memory device 1 will now be described.

FIG. 4A to FIG. 20C are schematic cross-sectional views showing the manufacturing process of the nonvolatile semiconductor memory device according to the embodiment.

The drawings of the numbers including "A" correspond to the schematic cross-sectional view taken along line B-B' mentioned above, the drawings of the numbers including "B" correspond to the schematic cross-sectional view taken along line C-C' mentioned above, and the drawings of the numbers including "C" correspond to the schematic cross-sectional view taken along line A-A' mentioned above.

First, as shown in FIG. 4A to FIG. 4C, a stacked structure 100 that includes the gate insulating film 20 provided on the semiconductor layer 10 and the charge storage layer 30 provided on the gate insulating film 20 is formed. The gate insulating film 20 and the charge storage layer 30 are formed by CVD (chemical vapor deposition), for example.

Subsequently, a plurality of mask layers 90 extending in the Y-direction and arranged in the X-direction are patterned on the stacked structure 100. The mask layer 90 is a resist layer, an oxide film layer, a nitride film layer, or the like, for example. Then, etching processing is performed on the stacked structure 100 exposed from the mask layer 90. The etching is RIE (reactive ion etching), for example. After the etching processing, the mask layer 90 is removed. FIG. 5A to FIG. 5C show this state.

As shown FIG. 5A to FIG. 5C, a plurality of trenches 100t extending in the Y-direction and arranged in the X-direction are formed in the stacked structure 100. By the formation of the trench 100t, a plurality of semiconductor regions 11 extending in the Y-direction and arranged in the X-direction are formed. The gate insulating film 20 is provided on each of the plurality of semiconductor regions 11. At this stage, the gate insulating film 20 extends in the Y-direction. The charge storage layer 30 is formed on the gate insulating film 20. At this stage, the charge storage layer 30 extends in the Y-direction.

Next, as shown in FIG. 6A to FIG. 6C, the element isolation region 50 is formed in each of the plurality of trenches 100t. CMP (chemical mechanical polishing) is performed on the upper surface of the element isolation region 50 as appropriate. Thereby, the top 30u of the charge storage layer 30 and the top 50u of the element isolation region 50 become flush.

Next, as shown in FIG. FIG. 7A to FIG. 7C, etchback is performed on the element isolation region 50. Thereby, the element isolation region 50 is formed in each of the plurality of trenches 100t. The top 30u of the charge storage layer 30 and part of the side wall 30w of the charge storage layer 30 leading to the top 30u are exposed from the element isolation region 50.

Next, as shown in FIG. 8A to FIG. 8C, the gate insulating film 40 is formed on the top 30u of the charge storage layer 30 and on part of the side wall 30w of the charge storage layer 30. Subsequently, the polysilicon-containing layer 60a is formed on the gate insulating film 40. CMP processing is performed on the upper surface of the polysilicon-containing layer 60a.

Next, as shown in FIG. 9A to FIG. 9B, a mask layer 91 is patterned on the polysilicon-containing layer 60a. The mask layer 91 is a resist layer, an oxide film layer, a nitride film layer, or the like, for example. The mask layer 91 has an opening 91h extending in the X-direction.

Subsequently, etching processing (e.g. RIE) is performed on the polysilicon-containing layer 60a exposed from the mask layer 91, the gate insulating film 40 under the exposed polysilicon-containing layer 60a, and part of the underlying charge storage layer 30. FIG. 10A to FIG. 10C show this state.

As shown in FIG. 10A to FIG. 10C, a trench 60t extending in the X-direction is formed in the polysilicon-containing layer 60a, the gate insulating film 40, and the charge storage layer 30.

Next, as shown in FIG. 11A to FIG. 11B, the metal-containing layer 60b is formed in the trench 60t and on the polysilicon-containing layer 60a. Thereby, a gate electrode layer 60L including the polysilicon-containing layer 60a and the metal-containing layer 60b is formed on the gate insulating film 40. The insulating film 70 is formed on the metal-containing layer 60b.

Next, as shown in FIG. 12A to FIG. 12C, a mask layer 92 is patterned on the insulating film 70. The mask layer 92 is a resist layer, an oxide film layer, a nitride film layer, or the like, for example. The mask layer 92 covers the region where the select gate electrode will be formed and the region where the memory cell will be formed.

Subsequently, etching processing is performed on a stacked structure 101 that includes the gate electrode layer 60L, the gate insulating film 40, the charge storage layer, and the element isolation region 50. That is, etching processing is performed on the stacked structure 101 exposed from the mask layer 92. FIG. 13A to FIG. 13C show this state.

As shown in FIG. 13A to FIG. 13C, a plurality of trenches 101t extending in the X-direction and arranged in the Y-direction are formed in the stacked structure 101 to form a plurality of control gate electrodes 60 extending in the X-direction and arranged in the Y-direction and the select gate electrode 61 aligned with the plurality of control gate electrodes 60. Furthermore, the charge storage layer 30 provided between each of the plurality of control gate electrodes 60 and each of the plurality of semiconductor regions 11 and the gate insulating film 40 provided between each of the plurality of control gate electrodes 60 and the charge storage layer 30 are formed.

Here, the select gate electrode 61 is formed by separating the gate electrode layer 60L and the charge storage layer 30 shown in FIG. 12A in the Y-direction. From FIG. 13A, "61" is used as the reference numeral of the select gate electrode. In addition, "31 and 61a" are used as the reference numerals of the polysilicon-containing layers included in the select gate electrode 61. "61b" is used as the reference numeral of the metal-containing layer.

Next, as shown in FIG. 14A to FIG. 14C, wet etching is performed to remove part of the element isolation region 50 via the plurality of trenches 101t. For example, through the plurality of trenches 101t, a chemical liquid (e.g. a dilute hydrofluoric acid solution) is introduced to the element isolation region 50 to dissolve and remove part of the element isolation region 50. Here, the part of the element isolation region 50 is an upper portion of the element isolation region 50, for example.

When the element isolation region 50 is formed, the film quality of the element isolation region 50 is adjusted so that the etching rate of the element isolation region 50 is higher than the etching rate of the gate insulating films 20 and 40. For example, the etching rate of the element isolation region 50 is 10 times to 30 times the etching rate of the gate insulating films 20 and 40. Thus, in the wet etching, the element isolation region 50 is preferentially removed even when the element isolation region 50 and the gate insulating films 20 and 40 have the same composition. The density of the element isolation region 50 is lower than the density of the gate insulating films 20 and 40, for example.

Thereby, a space 55 is formed between semiconductor regions 11 in the X-direction (FIG. 14C). Part of the side wall 30w of the charge storage layer 30 and part of the gate insulating film 40 are exposed at the space 55. The spaces 55 are joined together on the lower side of the plurality of control gate electrodes 60 and on the lower side of the select gate electrode 61 (FIG. 14B). The space 55 leads also to the trench 101t between control gate electrodes 60 and the trench 101t between the control gate electrode 60 and the select gate electrode 61.

Next, as shown in FIG. 15A to FIG. 15C, a sacrifice layer 85 is formed in the space 55, in the plurality of trenches 101t, and on the side wall 61w of the select gate electrode 61. The plurality of control gate electrodes 60 and the select gate electrode 61 are covered with the sacrifice layer 85. A carbon-containing layer is used as the sacrifice layer 85. For example, the sacrifice layer 85 is a CVD carbon layer formed under conditions of good step coatability. Specifically, the sacrifice layer 85 contains amorphous carbon. In the CVD, a gas in which 2-butyne is diluted with nitrogen is used. Other than this, the carbon-containing layer may be a resist, an epoxy resin, an acrylic resin, a polycarbonate resin, or the like. The carbon-containing layer may be a thermosetting resin, which is curable by heating.

For example, a resist, a resin solution, or the like is supplied into the space 55 via the trench 101t. Then, a resist, a resin solution, or the like is supplied onto the plurality of control gate electrodes 60, onto the select gate electrode 61, and onto the side wall 61w of the select gate electrode 61. After that, heating treatment is performed on the resist, the resin solution, or the like as necessary.

Next, as shown in FIG. 16A to FIG. 16C, etching processing (e.g. physical etching) is performed on the top 85u of the sacrifice layer 85. Thereby, the sacrifice layer 85 is formed in the space 55, in the plurality of trenches 101t, and on the side wall 61w of the select gate electrode 61.

Here, the top 85u of the sacrifice layer 85 between control gate electrodes 60 and the top 85u of the sacrifice layer 85 between the control gate electrode 60 and the select gate electrode 61 are formed so as to be recessed to the semiconductor layer 10 side, as an example. The top 85u of the sacrifice layer 85 at this stage may be processed so as to be flat, or may be processed so as to be convex upward.

After that, an impurity element is implanted into the semiconductor region 11, and activation treatment (temperature: approximately 1000° C.) is performed in an inert gas atmosphere, as necessary.

Figure 17A:
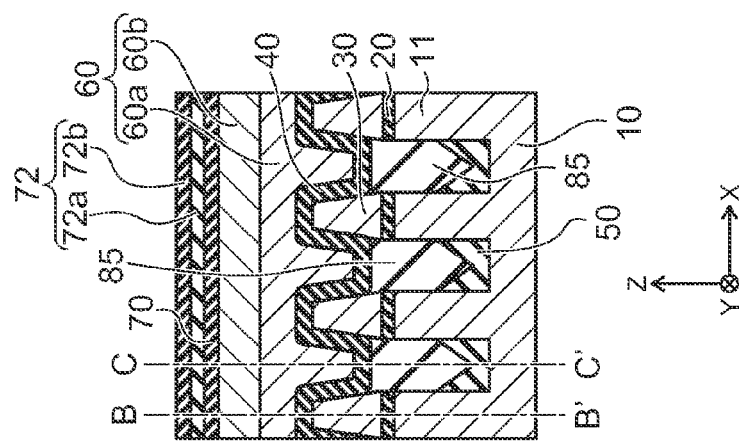
Figure 17B:
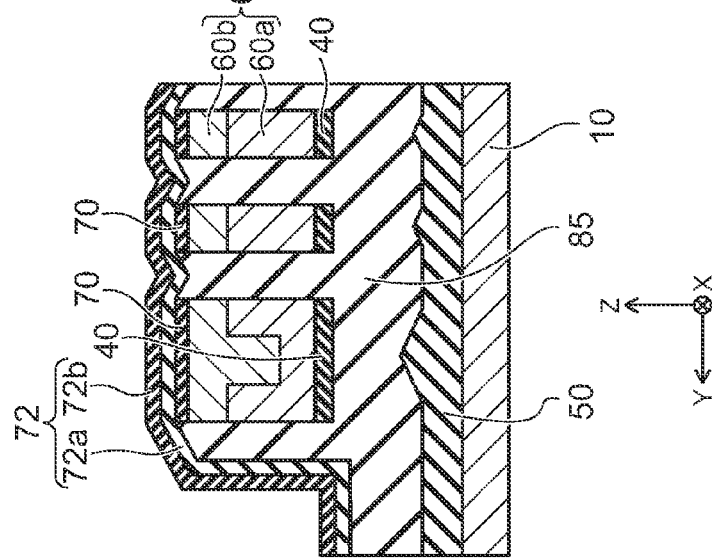
Figure 17C:
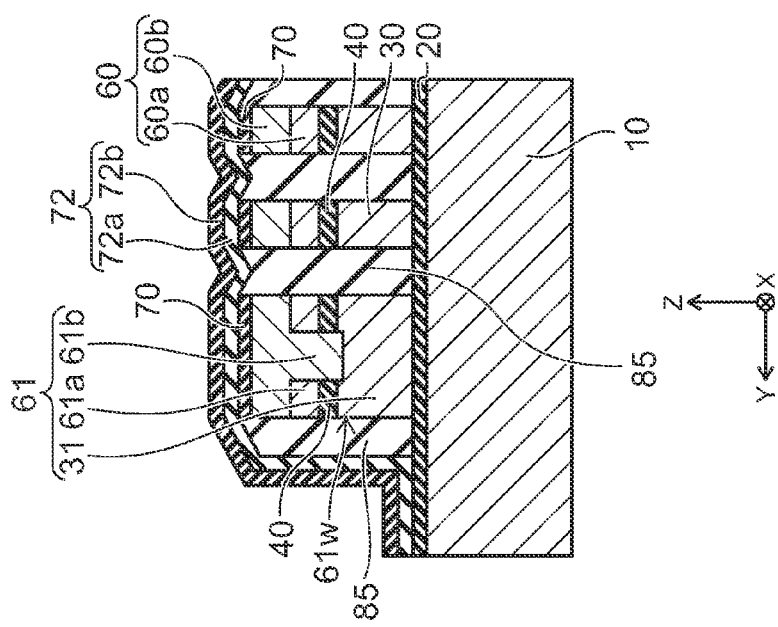

Next, as shown in FIG. 17A to FIG. 17C, the upper side of the plurality of control gate electrodes 60, the upper side of the select gate electrode 61, and the upper side of the sacrifice layer 85 are covered with the insulating layer 72. The insulating layer 72 includes the insulating layer 72a and the insulating layer 72b. Since the top 85u of the sacrifice layer 85 has been formed so as to be recessed to the semiconductor layer 10 side, also the insulating layer 72 formed on the top 85u is formed so as to be recessed to the semiconductor layer 10 side.

Next, as shown in FIG. 18A to FIG. 18C, the interlayer insulating film 80 is formed on the insulating layer 72. Subsequently, a contact hole 80h extending from the upper surface 80u of the interlayer insulating film 80 to the sacrifice layer 85 is formed (FIG. 18B). The contact hole 80h extends also from the upper surface 80u of the interlayer insulating film 80 to the semiconductor region 11 (FIG. 18A).

Next, as shown in FIG. 19A to FIG. 19C, the sacrifice layer 85 is removed via the contact hole 80h. For example, the sacrifice layer 85 is exposed to an organic solvent to dissolve the sacrifice layer 85 in the organic solvent to remove the sacrifice layer 85. Alternatively, the sacrifice layer 85 is exposed to an oxygen gas atmosphere, an oxygen plasma atmosphere, or the like to oxidize the sacrifice layer 85 to eliminate the sacrifice layer 85.

Thereby, a space 55 is formed between semiconductor regions 11. Furthermore, a space 55 is formed between control gate electrodes 60. Furthermore, a space 55 is formed between the control gate electrode 60 located on the outermost side out of the plurality of control gate electrodes 60 and the select gate electrode 61. The spaces 55 are joined together on the lower side of the plurality of control gate electrodes 60 and on the lower side of the select gate electrode 61. Part of the side wall 30w of the charge storage layer 30 and part of the insulating layer 72 are exposed at the space 55 between adjacent semiconductor regions 11.

After the sacrifice layer 85 is removed, the activation treatment of the impurity element implanted in the semiconductor region 11 (temperature: approximately 1000° C.) may be performed.

Figures 20A, 20B, 20C:
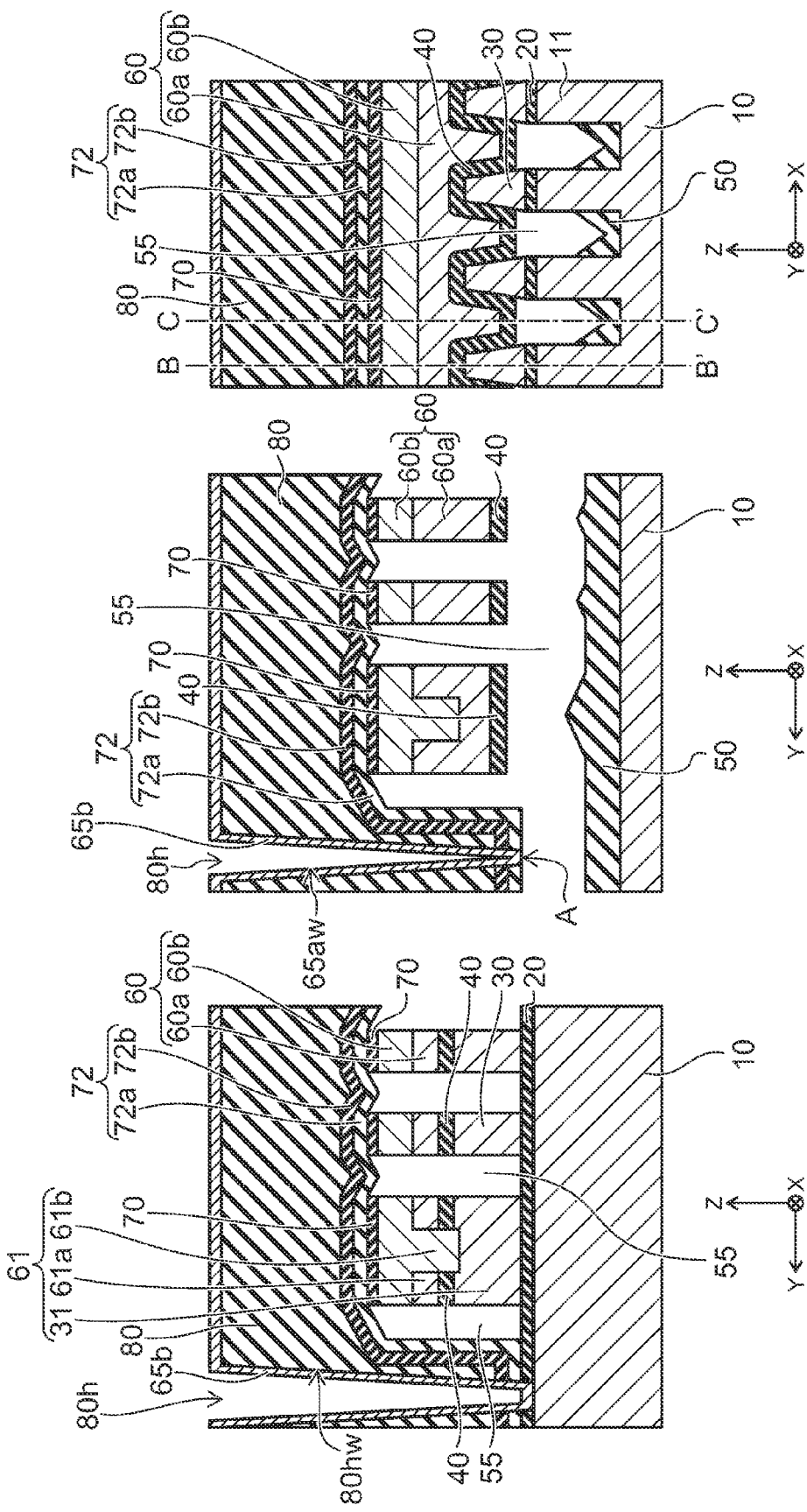

Next, as shown in FIG. 20A to FIG. 20C, the electrical conductor 65b is formed on the side wall 80hw of the contact hole 80h by, for example, LTS (long through sputter). At this time, since the width in the Y-direction of the contact hole 80h becomes narrower toward the semiconductor layer 10 side, the opening portion between the contact hole 80h and the space 55 (the opening portion indicated by arrow A) is sealed with the electrical conductor 65b. Below the contact hole 80h, the electrical conductor 65b is in contact with the semiconductor region 11 (FIG. 2A).

After that, as shown in FIG. 2A to FIG. 2C, the electrical conductor 65a is formed on the electrical conductor 65b. That is, the conductive layer 65 is formed in the contact hole 80h. Through such a manufacturing process, the nonvolatile semiconductor memory device 1 is formed.

The description of the formation of the contact hole 80h and the formation of the electrical conductor 65b is supplemented using other cross-sectional views.

FIG. 21A to FIG. 21C are schematic cross-sectional views showing the manufacturing process of the nonvolatile semiconductor memory device according to the embodiment.

FIG. 21A to FIG. 21C show a cross section taken along line A-A' at and around the contact hole 80h.

As shown in FIG. 21A, the contact hole 80h is formed such that the center line 11c of the semiconductor region 11 and the center line 65c of the contact hole 80h are shifted from each other in the X-direction.

Next, as shown in FIG. 21B, the sacrifice layer 85 is removed via the contact hole 80h.

Next, as shown in FIG. 21C, the electrical conductor 65b is formed on the side wall 80hw of the contact hole 80h. At this time, the opening portion between the contact hole 80h and the space 55 (arrow A) is sealed with the electrical conductor 65b. Below the contact hole 80h, the electrical conductor 65b is in contact with the semiconductor region 11.

If processes are advanced without sealing the opening portion between the contact hole 80h and the space 55 with the electrical conductor 65b, the conductive layer 65a subsequently formed may enter the space 55. In such a case, adjacent semiconductor regions 11 or adjacent charge storage layers 30 will short-circuit via the conductive layer 65a, for example. In the embodiment, in order to avoid such a defect, the opening portion between the contact hole 80h and the space 55 is sealed with the electrical conductor 65b before forming the conductive layer 65a.

After that, heating treatment may be performed to produce a reaction between the semiconductor region 11 and the electrical conductor 65b, as necessary. For example, silicon (Si) contained in the semiconductor region 11 and titanium (Ti) contained in the electrical conductor 65b may be reacted together to form a titanium silicide layer between the semiconductor region 11 and the electrical conductor 65b. Thereby, the contact resistance between the semiconductor region 11 and the electrical conductor 65b is reduced. After that, the electrical conductor 65a is formed as shown in FIG. 3.

Before effects of the embodiment are described, an embodiment according to a reference example is described.

In the manufacturing process of a nonvolatile semiconductor memory device according to the reference example, the manufacturing processes of FIG. 4A to FIG. 13C described above are diverted. Thus, a description is given from the process after FIG. 13A to FIG. 13C.

FIG. 22A to FIG. 27C are schematic cross-sectional views showing the manufacturing process of the nonvolatile semiconductor memory device according to the reference example.

First, as shown in FIG. 22A to FIG. 22C, an insulating layer 87 is formed in the trench 101*t*, on each of the plurality of control gate electrodes 60, on the select gate electrode 61, and on the side wall 61*w* of the select gate electrode 61 by CVD. Here, in order to reduce the parasitic capacitance between memory cells, the insulating layer 87 is formed such that a space 55 remains between memory cells. For example, the insulating layer 87 is formed under conditions where step coatability is less good.

Figure 23A:
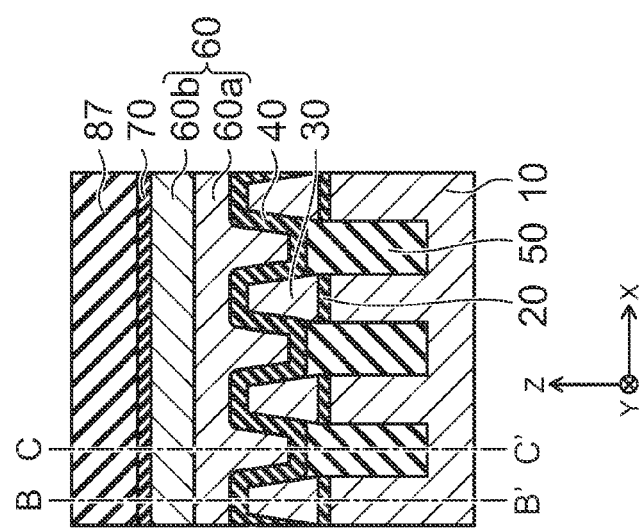
Figure 23B:
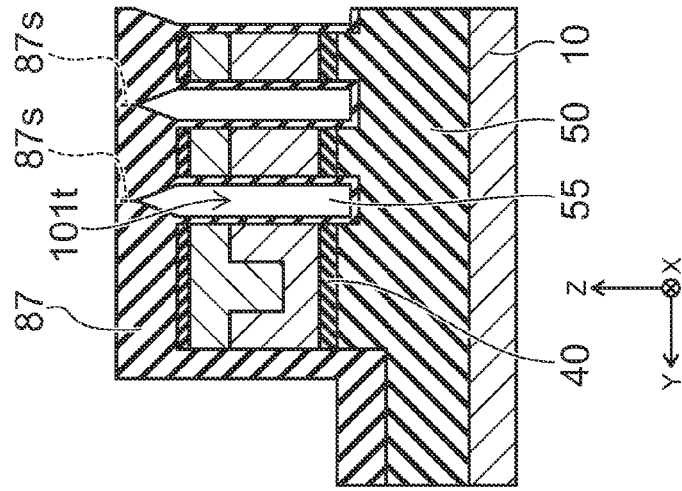
Figure 23C:
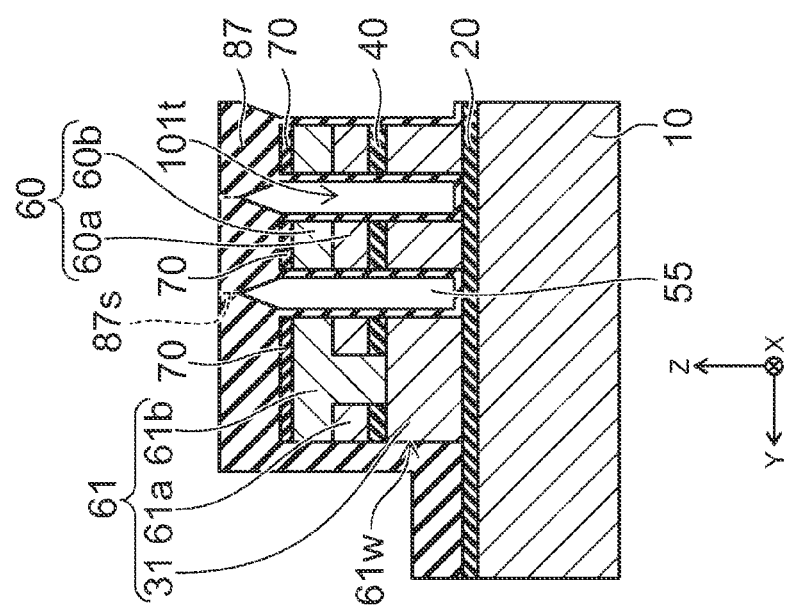

Subsequently, from the state shown in FIG. 22A to FIG. 22C, film formation is carried out until the opening of the upper portion of the trench 101 is completely sealed with the insulating layer 87. FIG. 23A to FIG. 23C show this state.

As shown in FIG. 23A to FIG. 23C, the interior of the trench 101*t* is not completely filled with the insulating layer 87, and the space 55 remains in the trench 101*t*.

However, the insulating layer 87 is a layer formed by increasing the film thickness of the insulating layers 87 formed on the plurality of control gate electrodes 60 and on the select gate electrode 61. In other words, the insulating layer 87 is a layer in which the insulating layers 87 formed on the plurality of control gate electrodes 60 and on the select gate electrode 61 are joined together. Consequently, a narrow space called a seam 87*s* may be formed in the insulating layer 87 above the space (that is, the portion where layers are joined together).

Furthermore, in the reference example, a configuration is obtained in which the insulating layer 87 formed like a bridge between control gate electrodes 60 does not protrude toward the space 55. In other words, a configuration is obtained in which the space 55 protrudes to the insulating layer 87 side.

Figure 24A:
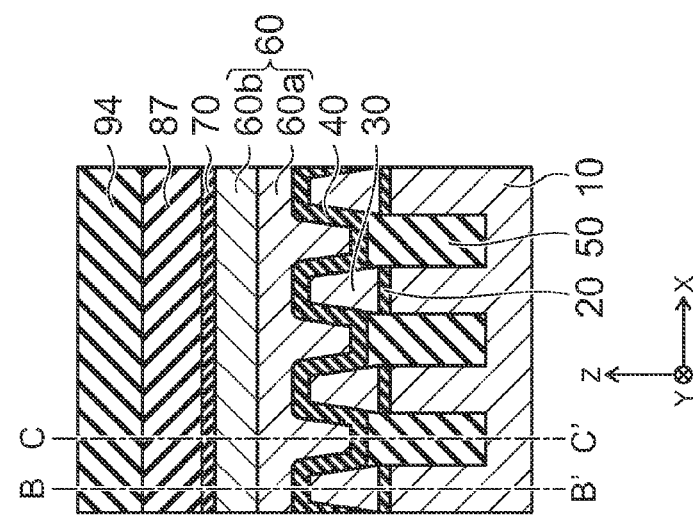
Figure 24B:
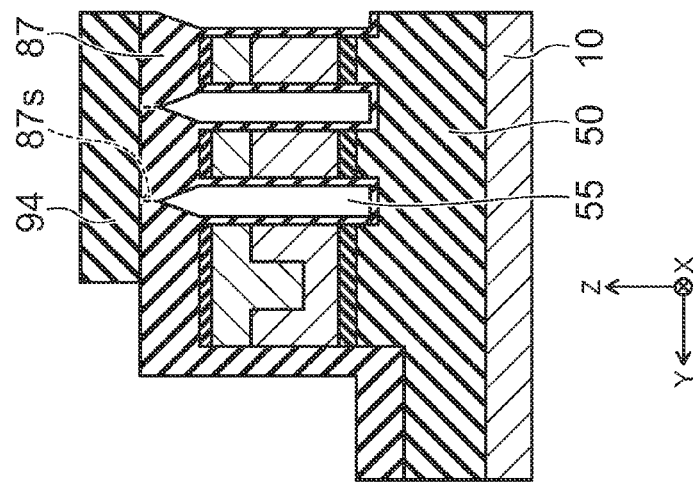
Figure 24C:
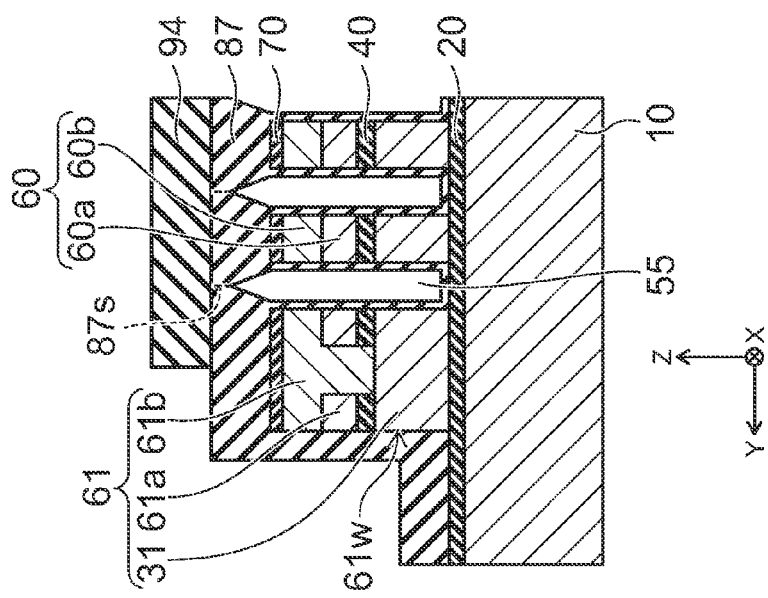

Next, as shown in FIG. 24A to FIG. 24C, a mask layer 94 is formed on the insulating layer 87. The mask layer 94 is formed so as to cover the plurality of control gate electrodes 60 and almost half of the select gate electrode 61.

Figure 25A:
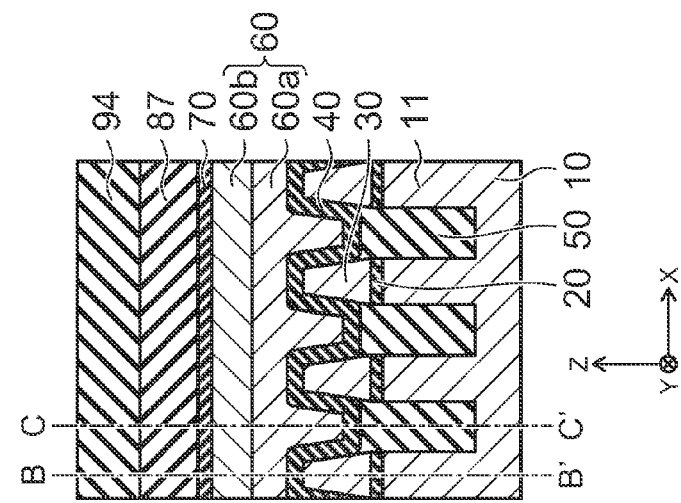
Figure 25B:
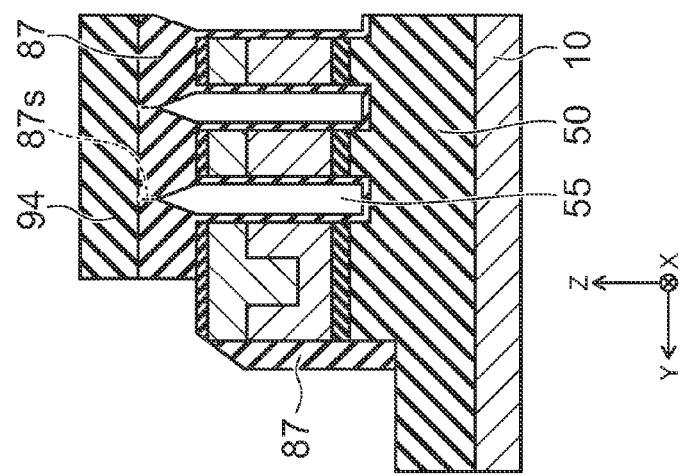
Figure 25C:
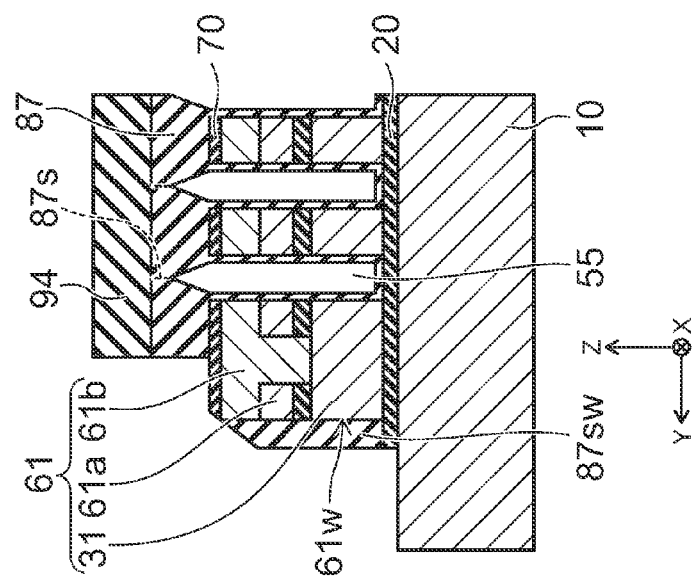

Next, as shown in FIG. 25A to FIG. 25C, etching processing is performed on the insulating layer 87 exposed from the mask layer 94. The etching processing of the insulating layer 87 is performed until the insulating film 70 on the select gate electrode 61 is exposed, for example. Thereby, a side wall film 87*sw* formed by being separated from the insulating layer 87 is formed on the side wall 61*w* of the select gate electrode 61.

Next, as shown in FIG. 26A to FIG. 26C, the insulating layer 72*a* is formed on the insulating layer 87, on the insulating film 70 provided on the select gate electrode 61, and on the side wall film 87*sw*, and the insulating layer 72*b* is formed on the insulating layer 72*a*. Thereby, the insulating layer 72 including the insulating layer 72*a* and the insulating layer 72*b* is formed.

Next, as shown in FIG. 27A to FIG. 27C, the interlayer insulating film 80 is formed on the insulating layer 72. After that, a contact hole 80*h* is formed, and the conductive layer 65 is formed in the contact hole 80*h*, as necessary.

In the reference example, although the insulating layer 87 is formed such that a space 55 remains between adjacent memory cells, the insulating layer 87 is formed between adjacent memory cells; thus, the coupling capacitance between adjacent memory cells is not reduced. Consequently, memory cells may interfere with each other during the writing and erasing of data.

Furthermore, in the reference example, there is a possibility that the gate insulating film 20 will be covered with the insulating layer 87. Therefore, stress may be applied to the gate insulating film 20, and a charge trap level may be formed in the gate insulating film 20. If a charge is likely to be trapped in the gate insulating film 20, the efficiency of the injection of a charge into the charge storage layer 30 and the charge retention properties of the charge storage layer 30 are degraded.

Furthermore, in the reference example, there is a possibility that a seam 87*s* will be formed in the insulating layer 87 formed above the space 55. In such a case, in the chemical liquid treatment performed after the formation of the insulating layer 87, the chemical liquid may go through the seam 87*s* to get between memory cells. Consequently, the memory cells may be contaminated and degraded by the chemical liquid.

In contrast, in the embodiment, the sacrifice layer 85 is removed from between adjacent memory cells, and a space 55 is formed between adjacent memory cells. Furthermore, the spaces 55 are joined together on the lower side of the plurality of control gate electrodes 60 and on the lower side of the select gate electrode 61 (FIG. 14A to FIG. 14C). Since the insulating layer 72 is formed on the sacrifice layer 85 provided between adjacent memory cells, the insulating layer 72 does not get between adjacent memory cells (FIG. 17A to FIG. 17C).

That is, in the embodiment, air having a very small permittivity exists between memory cells, or the portion between memory cells is in a reduced pressure state. Therefore, the coupling capacitance between adjacent memory cells is reduced to suppress the interference between memory cells during the writing and erasing of data.

Furthermore, between memory cells in the embodiment, the gate insulating film 20 is not covered with the insulating layer 72 (FIG. 19A to FIG. 19C). Therefore, stress is less likely to be applied to the gate insulating film 20, and a charge trap level is less likely to be formed in the gate insulating film 20. Thereby, the efficiency of the injection of a charge into the charge storage layer 30 and the charge retention properties of the charge storage layer 30 are improved.

Furthermore, in the embodiment, since the insulating layer 72 is formed on the sacrifice layer 85 provided between adjacent memory cells, a seam is less likely to be formed in the insulating layer 72 (FIG. 17A to FIG. 17C). In other words, the insulating layer 72 is not a layer formed by the joining of the insulating layers 87 formed on the plurality of control gate electrodes 60 and on the select gate electrode 61. Therefore, even when chemical liquid treatment is performed after the formation of the insulating layer 72, there is no case where the chemical liquid goes through the seam to get between memory cells.

Furthermore, in the embodiment, when the insulating layer 72 and the interlayer insulating film 80 are formed on the upper side of the plurality of memory cells, each of the plurality of memory cells is supported by the sacrifice layer 85 (FIG. 18A to FIG. 18C). Therefore, after the insulating layer 72 and the interlayer insulating film 80 are formed on the upper side of the plurality of memory cells, there is no case where the memory cell falls down due to the stress applied from the insulating layer 72 and the interlayer insulating film 80. Furthermore, adjacent memory cells do not come into contact.

Furthermore, in the embodiment, the electrical conductor 65*a* is formed after the opening portion between the contact hole 80*h* formed in the interlayer insulating film 80 and the space 55 is sealed with the electrical conductor 65*b*. Therefore, the conductive layer 65*a* does not enter the space 55, and adjacent semiconductor regions 11 and adjacent charge storage layers 30 are prevented from short-circuiting via the conductive layer 65*a*.

As described above, the embodiment provides a highly reliable nonvolatile semiconductor memory device.

In the embodiments described above, the term "on" in "a portion A is provided on a portion B" may refer to not only the case where the portion A is provided on the portion B such that the portion A is in contact with the portion B but also the case where the portion A is provided above the portion B such that the portion A is not in contact with the portion B. Furthermore, "a portion A is provided on a portion B" may refer to the case where the portion A and the portion B are inverted and the portion A is located below the portion B and the case where the portion A and the portion B are laterally juxtaposed. This is because, even when the semiconductor device according to the embodiment is rotated, the structure of the semiconductor device is not changed by the rotation.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a nonvolatile semiconductor memory device comprising:
   (a) forming a first stacked structure including a second insulating film provided on a semiconductor layer and a charge storage layer provided on the second insulating film;
   (b) forming a plurality of first trenches in the first stacked structure to form a plurality of first semiconductor regions, the second insulating film, and the charge storage layer, the plurality of first trenches extending in a first direction and being arranged in a direction crossing the first direction, the plurality of first semiconductor regions extending in the first direction and being arranged in a direction crossing the first direction, the second insulating film being provided on each of the plurality of first semiconductor regions and extending in the first direction, the charge storage layer being provided on the second insulating film and extending in the first direction;
   (c) forming an element isolation region in each of the plurality of first trenches in a manner, and a top of the charge storage layer and part of a side wall of the charge storage layer leading to the top are exposed in the manner;
   (d) forming a first insulating film on the top of the charge storage layer and on the part of the side wall of the charge storage layer;
   (e) forming a gate electrode layer on the first insulating film;
   (f) forming a plurality of second trenches in a second stacked structure including the gate electrode layer, the first insulating film, the charge storage layer, and the element isolation region to form a plurality of control gate electrodes, a select gate electrode, the charge storage layer, and the first insulating film, the plurality of second trenches extending in a second direction and being arranged in a direction crossing the second direction, the plurality of control gate electrodes extending in the second direction and being arranged in a direction crossing the second direction, the select gate electrode being aligned with the plurality of control gate electrodes, the charge storage layer being provided between each of the plurality of control gate electrodes and each of the plurality of first semiconductor regions, the first insulating film being provided between each of the plurality of control gate electrodes and the charge storage layer;
   (g) removing part of the element isolation region via the plurality of second trenches to form a space between adjacent ones of the plurality of first semiconductor regions in a direction crossing the first direction and to expose part of the charge storage layer and part of the first insulating film at the space between adjacent ones of the plurality of first semiconductor regions in the direction crossing the first direction;
   (h) forming a sacrifice layer in the space, in the plurality of second trenches, and on a side wall of the select gate electrode;
   (i) covering an upper side of the plurality of control gate electrodes, an upper side of the select gate electrode, and an upper side of the sacrifice layer with a first insulating layer;
   (j) forming an interlayer insulating film on the first insulating layer;
   (k) forming a hole extending from an upper surface of the interlayer insulating film to the sacrifice layer and to each of the plurality of first semiconductor regions; and
   (l) removing the sacrifice layer via the hole to form the space between adjacent ones of the plurality of first semiconductor regions, between adjacent ones of the plurality of control gate electrodes, and between a control gate electrode located on an outermost side out of the plurality of control gate electrodes and the select gate electrode, and to expose part of a side wall of the charge storage layer and part of the first insulating film at the space between adjacent ones of the plurality of first semiconductor regions.

2. The method according to claim 1, wherein a carbon-containing layer is used as the sacrifice layer.

3. The method according to claim 1, wherein in the (g) process, a chemical liquid is introduced into the plurality of second trenches to perform wet etching to remove part of the element isolation region.

4. The method according to claim 1, wherein in the (h) process, the sacrifice layer is formed in a manner, and a top of the sacrifice layer formed in the plurality of second trenches is recessed in the manner.

5. The method according to claim 4, wherein a top of the sacrifice layer is recessed by performing physical etching on the sacrifice layer.

6. The method according to claim 1, wherein in the (l) process, the sacrifice layer is removed by being exposed to one of an organic solvent, an oxygen gas atmosphere, and oxygen plasma.

7. The method according to claim 1, wherein in the (k) process, the hole is formed in a manner, and a center line of each of the plurality of first semiconductor regions and a center line of the hole are shifted from each other in the second direction in the manner.

8. The method according to claim 1, wherein after the (l) process, a second electrical conductor is formed on a side wall of the hole, an opening between the hole and the space is sealed with the second electrical conductor, and then a first electrical conductor is formed, a side wall and a bottom of the first electrical conductor are in contact to the second electrical conductor, and a conductive layer including the first electrical conductor and the second electrical conductor in the hole are formed.

9. The method according to claim 8, wherein the second electrical conductor is brought into contact with an upper surface and a side wall of the plurality of semiconductor regions.

* * * * *